(12) United States Patent
El-Ghoroury et al.

(10) Patent No.: US 6,456,950 B1
(45) Date of Patent: Sep. 24, 2002

(54) METHOD AND APPARATUS FOR ESTIMATING AND DIGITIZING INSTANTANEOUS FREQUENCY AND PHASE OF BANDPASS SIGNALS

(75) Inventors: Hussein S. El-Ghoroury, Carlsbad; Murat F. Karsi, Encinitas; Steven Deane Hall, Olivenhain, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/314,596

(22) Filed: May 19, 1999

(51) Int. Cl.⁷ .......................... G01R 23/00; G06F 19/00
(52) U.S. Cl. .......................... 702/75; 329/318; 331/25; 341/139; 375/341; 375/355; 702/FOR 109
(58) Field of Search .............................. 702/60, 75, 76, 702/190, FOR 107, FOR 108, FOR 109, FOR 110, FOR 154; 341/143; 329/50, 318; 375/11, 355

(56) References Cited

U.S. PATENT DOCUMENTS

| | | | | |
|---|---|---|---|---|
| 4,547,737 A | * | 10/1985 | Gibson | 329/50 |
| 4,994,754 A | * | 2/1991 | Ohta | 329/318 |
| 5,091,918 A | * | 2/1992 | Wales | 375/11 |
| 5,369,404 A | | 11/1994 | Galton | 341/143 |
| 5,504,784 A | * | 4/1996 | Niyogi et al. | 375/341 |
| 5,764,524 A | * | 6/1998 | Andersson et al. | 702/FOR 109 |
| 5,987,562 A | * | 11/1999 | Glover | 711/4 |
| 6,002,352 A | * | 12/1999 | El-Ghoroury et al. | 341/139 |
| 6,104,769 A | * | 8/2000 | Rainish | 375/355 |
| 6,211,742 B1 | * | 4/2001 | Tan et al. | 331/25 |

OTHER PUBLICATIONS

Ian Galton, "Higher–Order Delta–Sigma Frequency–to–Digital Conversion", pp 441–444, Department of Electrical & Computer Engineering, University of CA, Irvine, CA 92717.

Ian Galton, "A Practical Secord–Order Delta–Sigma Frequency–to–Digital Converter", pp 5–8, University of CA, Irvine, CA 92717.

R. Douglas Beards and Miles A Copeland, "An Oversampling Delta–Sigma Frequency Discriminator", IEEE Jan. 1994, vol. 41, No. 1, pp 26–32.

Ian Galton & George Zimmerman, "Combined RF Phase Extraction and Digitization", IEEE 1993, pp 1104–1107.

James C. Candy & Gabor C. Temes, "Oversampling Methods for A/D and D/A Conversion", pp 1–25.

* cited by examiner

Primary Examiner—John S. Hilten
Assistant Examiner—John Le
(74) Attorney, Agent, or Firm—Blakely, Sokoloff, Taylor & Zafman LLP

(57) ABSTRACT

The present invention is a method and apparatus to detect an instantaneous frequency of an input signal. A sampler samples the input signal to generate a sampled signal. A metric generator is coupled to the sampler to generate a metric signal based on the sampled signal. The metric signal has a magnitude proportional to the instantaneous frequency of the input signal. In another embodiment, the apparatus comprises a feedback circuit and a decimator. The feedback circuit generates a sequence signal from the input signal. The sequence signal represents a change of the instantaneous frequency of the input signal. The decimator is coupled to the feedback circuit to decimate the sequence signal to generate a frequency signal. The frequency signal providing the instantaneous frequency of the input signal.

18 Claims, 23 Drawing Sheets

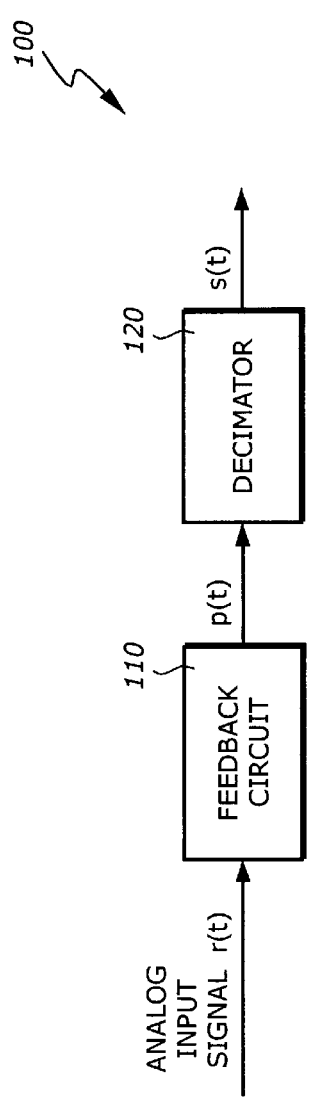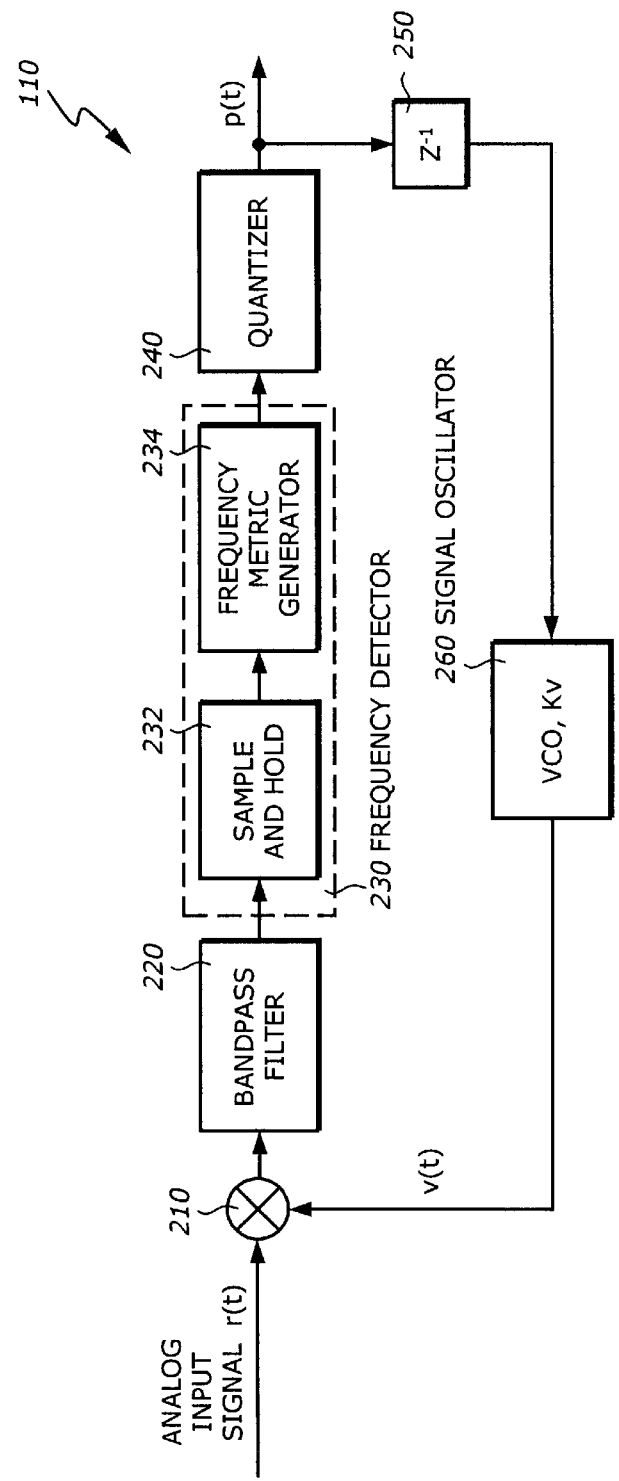

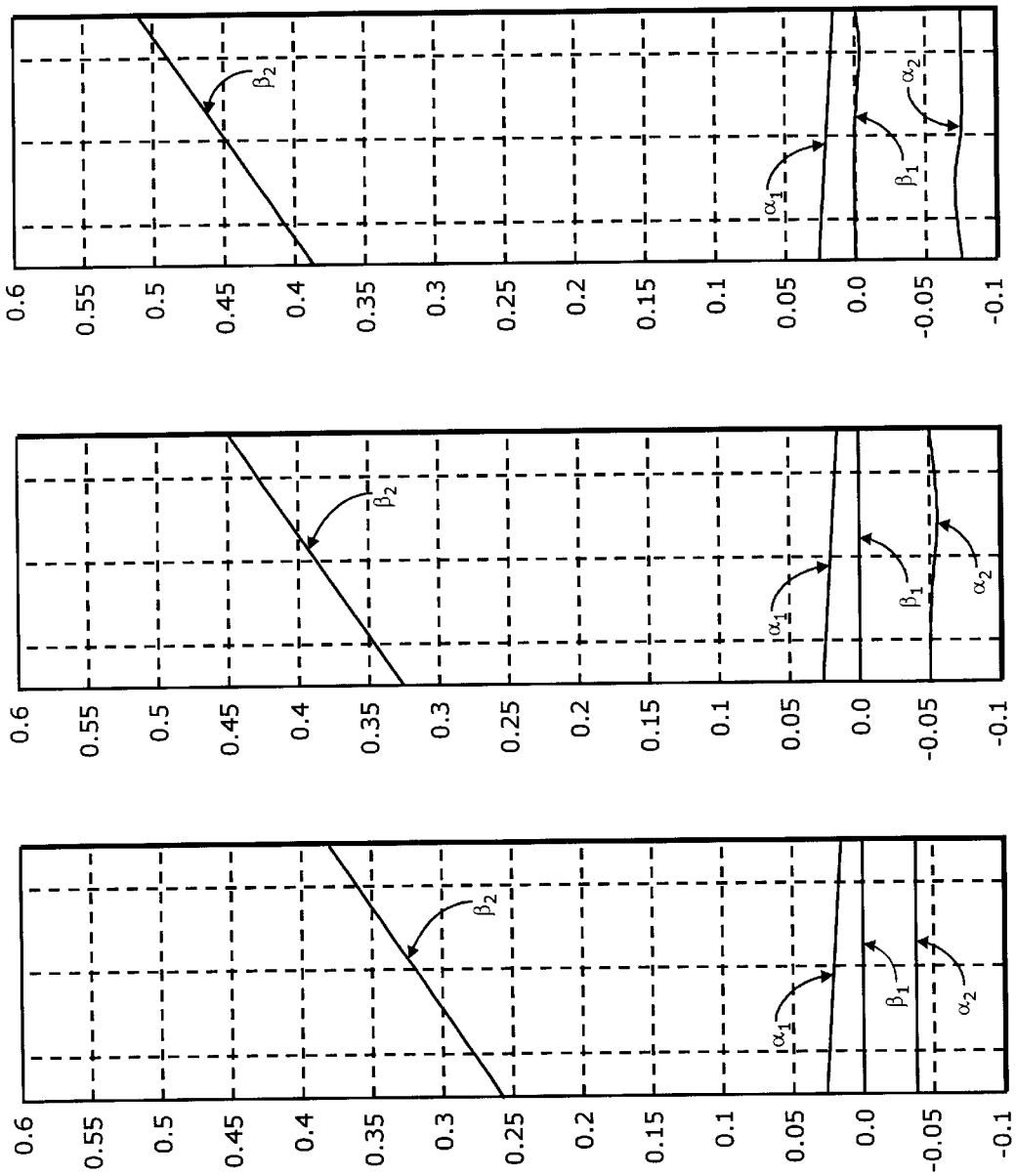

US 6,456,950 B1

METHOD AND APPARATUS FOR ESTIMATING AND DIGITIZING INSTANTANEOUS FREQUENCY AND PHASE OF BANDPASS SIGNALS

BACKGROUND OF THE INVENTION

1. Field of the Invention

The present invention relates to communication systems. In particular, the present invention relates to estimation of frequency and phase of analog signals.

2. Description of Related Art

Many modern day communications systems modulate phase and/or frequency of a carrier signal in order to convey information. In a communication receiver or a signal measurement instrument, a typical objective is to reverse the modulation operation on the received signal and determine the phase and/or frequency of the carrier signal.

Processing techniques used in a communications receiver may be analog or digital. In many modern day communication systems, signal processing is conducted digitally. In traditional receivers for reception of phase/angle modulated signals, analog-to-digital (A/D) conversion, down conversion to baseband, and, phase/frequency extraction are conducted separately. Typically the task of phase/frequency extraction is conducted after A/D conversion and the down conversion may be performed before or after A/D conversion depending on the system design preferences.

In such designs, the A/D conversion sub-system is optimized to get a high quality digital representation of the analog input signal. The design criterion for such systems has been based on minimizing the analog-to-digital converter (ADC) output signal amplitude quantization error. However, this is not necessarily optimal if the parameter of interest is actually the frequency and/or phase of the input signal. A system based on reducing the distortion in the frequency/phase of the input signal due to A/D conversion is likely to yield higher performance.

Accordingly, it is desirable to have a method and apparatus to efficiently and accurately estimate and/or digitize the instantaneous frequency and/or phase of an analog signal.

SUMMARY OF THE INVENTION

The present invention provides a method and apparatus to detect the instantaneous frequency of a signal. A sampler is used to sample the input signal. A metric generator uses the samples of the input signal to generate a metric signal whose magnitude is related to the instantaneous frequency of the input signal. With a minor modification to the frequency detector architecture, a power detector is obtained.

System, method and apparatus that are used for detecting and digitizing the instantaneous frequency of a signal are described. These utilize the frequency and power detectors. However, their use is not limited to frequency and power detectors presented with this patent application. These can be implemented with other types of frequency and power detectors. In one embodiment of the invention, the apparatus that is used to digitize the instantaneous frequency of a signal comprises a feedback circuit and a decimator. The feedback circuit generates a sequence signal from the input signal. The sequence signal contains the necessary information to detect and digitize the instantaneous frequency of the input signal. The decimator is coupled to the feedback circuit to decimate the frequency signal to generate a frequency signal. The frequency signal providing the instantaneous frequency of the input signal. Various embodiments of the feedback circuit are disclosed including an interpolative circuit and a predictive circuit.

BRIEF DESCRIPTION OF THE DRAWINGS

The objects, features and advantages of the present invention will become apparent from the following detailed description of the present invention in which:

FIG. 1 is a diagram illustration of a system 100 according to one embodiment of the invention.

FIG. 2 is a diagram illustration of a first-order interpolative circuit 110 in the time-domain according to one embodiment of the invention.

FIG. 15A is a diagram illustration of variations of the coefficients $\alpha_1$, $\beta_1$, $\alpha_2$, and $\beta_2$ as a function of $f_1$ for $f_2$=333 KHz, according to one embodiment of the invention.

FIG. 15B is a diagram illustration of variations of the coefficients $\alpha_1$, $\beta_1$, $\alpha_2$, and $\beta_2$ as a function of $f_1$ for $f_2$=400 KHz, according to one embodiment of the invention.

FIG. 15C is a diagram illustration of variations of the coefficients $\alpha_1$, $\beta_1$, $\alpha_2$, and $\beta_2$ as a function of $f_1$ for $f_2$=467 KHz, according to one embodiment of the invention.

DESCRIPTION OF THE PRESENT INVENTION

Figure 3:
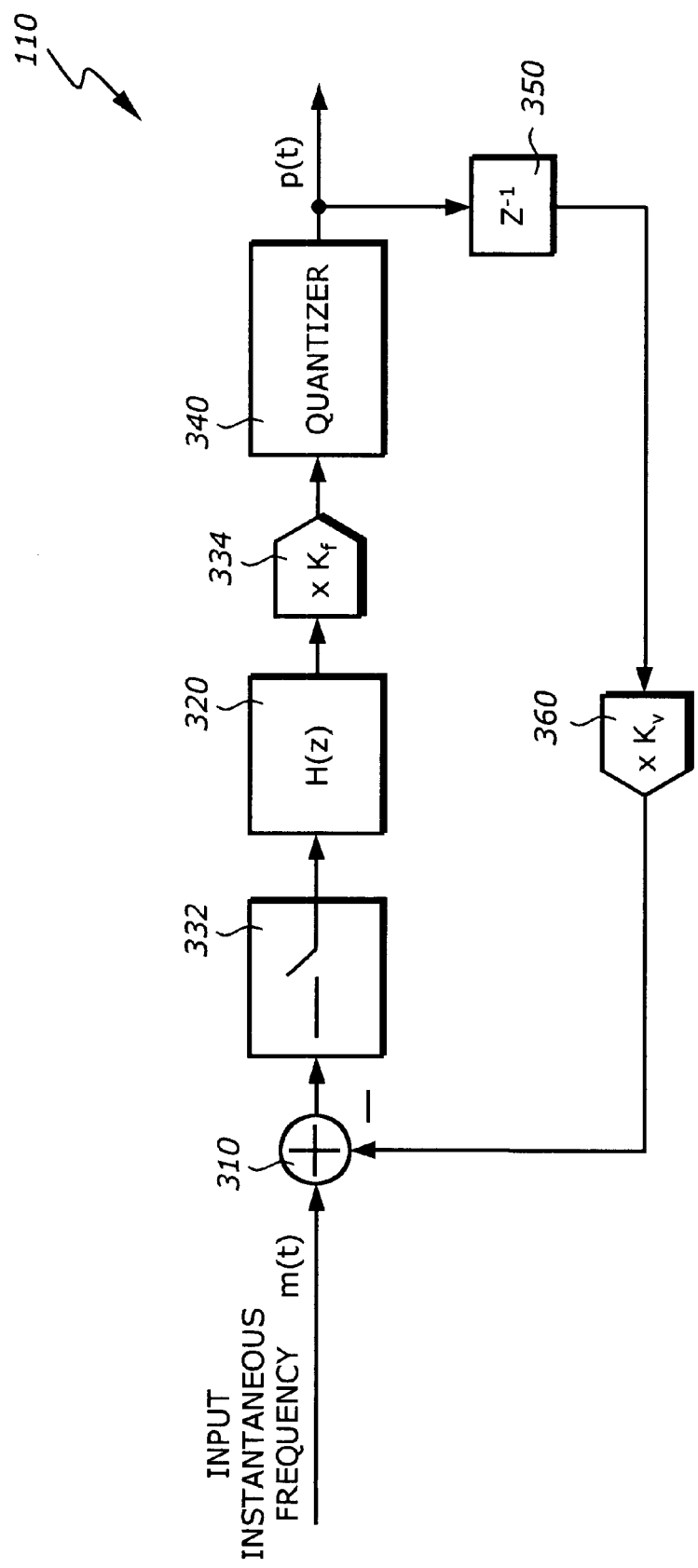
FIG. 3 is a diagram illustration of a first-order interpolative circuit 110 in the frequency-domain according to one embodiment of the invention.

The present invention provides a method and apparatus ("frequency detector") to detect the instantaneous frequency of a signal. A sampler is used to first sample the input signal. A metric generator uses the samples of the input signal to generate a metric signal whose magnitude is related to the instantaneous frequency of the input signal. With a minor modification to the frequency detector architecture, a power detector is easily obtained.

The system, method and apparatus for detecting and digitizing the instantaneous frequency of a signal are described. These utilize the frequency and power detectors. However, their use is not limited to frequency and power detectors presented with this patent application. These can be implemented with other types of frequency and power detectors. In one embodiment of the invention, the apparatus that is used to digitize the instantaneous frequency of a signal comprises a feedback circuit and a decimator. The feedback circuit generates a sequence signal from the input signal. The sequence signal contains the necessary information to detect and digitize the instantaneous frequency of the input signal. The decimator is coupled to the feedback circuit to decimate the frequency signal to generate a frequency signal. The frequency signal providing the instantaneous frequency of the input signal. Various embodiments of the feedback circuit are disclosed including the an interpolative circuit and a predictive circuit.

FIG. 1 is a diagram illustration of a system 100 according to one embodiment of the invention. The system 100 includes a feedback circuit 110 and a decimator 120.

The feedback circuit 110 receives an analog input signal r(t) and generates a sequence signal p(t). The analog input signal r(t) has an instantaneous frequency offset m(t) as a function of time and a carrier frequency $f_c$ from a carrier signal. The system 100 estimates and digitizes the instantaneous frequency m(t). The sequence signal p(t) represents a change in the instantaneous frequency m(t). The feedback circuit 110 may be a first-order, second-order, or arbitrary order interpolative circuit or a predictive circuit. Variations of the interpolative and predictive circuits will be described.

The analog input signal to the system, r(t), in FIG. 1 can be represented as $$r(t)=\sqrt{2}A(t)\cos[2\pi f_c t+q(t)]+n(t)=\sqrt{2}A(t)\cos[2\pi f_c t+2\pi\int_{-\infty}^{t}(t)dt]+n(t) \quad (1)$$

Here $\sqrt{2}A(t)$ is the amplitude of the input carrier, q(t) is the phase of the incoming carrier relative to the unmodulated carrier, m(t) is the input instantaneous frequency relative to the unmodulated carrier, $f_c$ is the input carrier frequency, and, n(t) is an additive noise process. Typically, one is interested in estimating the instantaneous phase, q(t), or, instantaneous frequency, m(t). The system 100 determines the instantaneous frequency m(t) directly from the input signal r(t). The instantaneous phase, q(t), can be obtained through integration of m(t). For exact determination of q(t) an initial value, $q(t_O)$, at a time instant $t_0<t$ should be known.

If the system is implemented with an interpolative scheme, the feedback loop output, p(t), is a very coarsely digitized version of the input signal frequency, m(t). Typically, p(t) can As take one of a few digital values. For example in a system using 1-bit quantization, p(t) can only take digital values +1 or −1 (hard limiting). To obtain an accurate digital representation of the input instantaneous frequency, interpolation of one bit output values is necessary.

The decimator 120 decimates the sequence signal p(t) to provide a refined estimated instantaneous frequency signal s(t). The decimator 120 includes a low pass filter used for noise reduction followed by a rate reducing filter for sampling rate reduction. This method of interpolative approximation of the parameter of interest, instantaneous frequency in this case, is similar to that utilized in interpolative encoding of the amplitudes of signals used in sigma-delta encoders.

For the interpolative method to work with high quality, it is clear that the sampling rate of the system should be high such that a precise approximation of the input instantaneous frequency can obtained by averaging a large number of coarse instantaneous frequency estimates. In the interpolative circuit of the present invention, the quantization noise at the digitized output is concentrated at high frequencies. This is called noise shaping. At DC, (f=0), the quantization noise spectrum has a null. However, the spectrum of the instantaneous frequency, m(t), is typically concentrated at low frequencies. Thus, with suitable is low pass filtering, the quantization noise that is more accentuated at higher frequencies is filtered out by the decimator 120.

A predictive circuit performs a multi-bit digital quantization of the instantaneous frequency of the analog input signal. The predictive feedback loop does not perform quantization noise shaping and the quantization noise spectrum is constant. However usage of decimation filtering is still necessary in order to eliminate the noise components outside the bandwidth of m(t) and reducing the sampling rate.

INTERPOLATIVE CIRCUITS

First-Order Interpolative Circuit

FIG. 2 is a diagram illustration of a first-order interpolative circuit 110 according to one embodiment of the invention. The first-order interpolative circuit 110 includes a mixer 210, a bandpass filter 220, a frequency detector 230, a quantizer 240, a delay element 250, and a voltage controlled oscillator 260.

The mixer 210 receives the analog input signal r(t) and mixes this input signal r(t) with a feedback signal v(t) to generate a product signal. The feedback signal v(t) is generated by the voltage controlled oscillator 260. The resulting product signal has two frequency components as a result of the mixing of the two signals r(t) and v(t). The two frequency components include a sum frequency and a difference frequency.

The bandpass filter 220 filters the product signal to eliminate the sum frequency component and retains essentially the difference frequency component as an output signal e(t).

The frequency detector 230 receives the filtered signal and generates a metric signal which corresponds to a suitable approximation to the instantaneous frequency of the input signal e(t). The frequency detector 230 includes a sampler 232 and a metric generator 234. The sampler 232 is a sample-and-hold device that samples the filtered signal at a sampling frequency to generate a sampled signal. The metric generator 234 provides the frequency metric signal from the sampled signal that indicates the frequency difference between r(t) and the estimated r(t).

The quantizer 240 converts the metric signal to generate the sequence signal p(t). The sequence signal p(t) is decimated by the decimator 120 to provide the frequency signal s(t) which is a quantized estimate of the instantaneous frequency m(t). The sequence signal p(t) is then used in the feedback loop to provide the feedback signal v(t). In the preferred embodiment the quantizer is a hard limiter, the quantizer 240 essentially compares the metric signal with a threshold value and generates an above and a below value depending on whether the metric signal is above or below the threshold, respectively. In one embodiment, the above and below values are positive and negative values. Examples of the hard-limited values are (+1, −1). Additionally, the quantizer can be implemented with a multiple bit quantizer such as an analog to digital converter.

The delay element 250 reflects the digital nature of the system. The delay notation in the figure is necessary to take into account the delay path of the feedback loop due to the discrete nature of the sampling process. In one embodiment, the delay interval is one clock period of the sampling frequency of the sampler 232. The control signal is used to control the voltage controlled oscillator 260.

The signal oscillator 260 receives the control signal from the delay element and generates the feedback signal v(t). In one embodiment, the signal oscillator 260 is a voltage-controlled oscillator (VCO) with a gain of $K_v$. The feedback signal or the VCO output v(t) has the form:

$$v(t) = \sqrt{2} \cos\left[2\pi f_2 t + 2\pi K_v \int_{-\infty}^{t} p(t)\,dt\right] \quad (2)$$

Here $K_v$ is the VCO gain that has dimension of (sec. volt)$^{-1}$. The parameter $f_2$ is the center frequency of oscillation for the VCO. The input signal to the VCO is the delayed sequence signal which is a discrete-time, discrete amplitude sequence that can take hard-limited values. In one embodiment where the quantizer is a hard limiter, the hard-limited values include +1 and −1. Thus the VCO oscillates between two frequencies $f_{low}=f_2-K_v$, and $f_{high}=f_2+K_v$.

The feedback loop functions such that the average frequency at the VCO output tracks the instantaneous frequency of the input signal, r(t). This is done through the creation of the metric signal at the output of the frequency detector 230. The metric signal is an error signal representing the error in the approximation of the instantaneous frequency of the input signal by the average frequency of the VCO output. The metric signal is essentially an error signal indicative the error of the approximation or estimation of the instantaneous frequency, m(t).

A frequency-domain equivalent model of operation for the feedback circuit 110 is useful to understand how the feedback circuit 110 operates as a sigma-delta encoder in the frequency-domain. In developing the model, understanding of the function of the bandpass filter is fundamental.

One of the functions of the bandpass filter (BPF) 220 is to remove the sum frequency component as mentioned earlier. The BPF 220 works together with the frequency detector 230 to implement the functionality of a low pass filter in the frequency-domain. This is can be explained as follows. Consider the output of a bandpass filter whose input is a constant magnitude sinusoidal signal with the same frequency as the input. The output of the BPF, in steady state, is a constant magnitude sinusoidal signal with the same frequency as the input. If the input signal frequency is instantaneously increased while keeping the signal magnitude the same (i.e. a "frequency step"), the instantaneous frequency of the output does not increase abruptly, but, it changes gradually to the new input signal frequency. The change of the instantaneous frequency occurs with a time constant in the order of 1/BW, where BW is the bandwidth of the BPF. Thus for a step in input frequency, a ramp in the output frequency is observed. The output frequency settles to the new input frequency and the rate of change of the output frequency is not constant la while the output frequency changes. However, there is generally a time interval where the output frequency increases/or decreases with time with a constant rate of change. This time interval is in the order of 1/BW. If there is no input signal change for an extended duration of time, the output frequency settles to the input signal frequency. If the input signal frequency content is constantly changing with a time constant less than 1/BW, output frequency of the BPF will try to follow the input signal frequency while performing a low pass filtering operation.

For the circuit shown in FIG. 2, the quantizer is a 1-bit ADC (hard-limiter) the output of the BPF is a signal whose instantaneous frequency varies between $f_c+m(t)-f_2-K_v$, and, $f_c+m(t)-f_2+K_v$. When the input signal changes with a rate in the order of the clock rate of the system, that is, much faster relative to BPF time constants, the BPF does not respond to the instantaneous changes of the frequency of its input signal but it responds to the average frequency of its input signal. Note that the average input signal frequency is a time weighted average of the low and high frequencies $f_c+m(t)-f_2-K_v$ and $f_c+m(t)-f_2+K_v$. The average frequency of the input signal depends on the time duration the BPF input frequency takes its low and high values. For example, if the low and high values are equally likely, then the average frequency is $f_c+m(t)-f_2$.

The average frequency of the input signal that is reflected at the BPF output is measured by the frequency detector. For successful operation of the system, the BPF bandwidth is to be chosen appropriately. The bandwidth should not be much less than the bandwidth of m(t) in order to be able to track the changes in m(t). However, it should be less than the sampling rate so as not to respond to changes in the VCO output abruptly but to average out the VCO output frequency over several sampling periods.

Another function that the BPF serves is to remove the interfering signals that are present at the system input along with the desired signal. Examples of such signals include adjacent channel interferers (ACI) and blocking signals in a wireless communications scenario.

The instantaneous frequency detector that follows the BPF yields the instantaneous frequency of the signal at its input. Interferers that are not filtered by the BPF can significantly degrade the system performance.

The system can be implemented with a rather large bandwidth selection for the BPF so as to use the BPF to remove the sum frequency at the output of the multiplier/mixer 210. For a large bandwidth choice of the BPF the integration in the frequency-domain function of the BPF is not utilized. The BPF output quickly settles to the frequency of the signal at its input. After frequency measurement by the frequency detector 230 it is possible to use a low pass function, such as an integrator, to perform the integration on the instantaneous frequency. Although such a system works in principle in the absence of an interferer, use of a wide band BPF is not suitable if the system designer desires to reduce the distortion caused by the adjacent channel interferers. The reason is, the frequency detector is highly corrupted due to the presence of interferer.

If the system designer desires to reduce the distortion caused by the adjacent channel interferers, an alternative is to place the BPF preceding the system (before the multiplier/mixer). As a result the interferer signals will be removed before reaching the feedback loop. The mechanization of the sigma-delta principle then involves using a large bandwidth BPF to remove the sum frequency at the output of the multiplier/mixer, and an integrator following the frequency detector. As stated in the previous paragraph, for a large bandwidth choice of the BPF, the integration in the frequency-domain function of the BPF is not utilized. The BPF output quickly settles to the frequency of the signal at its input. After frequency measurement by the frequency detector one should use a low pass function (possibly an integrator) to perform the integration on the instantaneous frequency. This then becomes a predictive circuit.

FIG. 3 is a frequency domain model of a first-order interpolative circuit 110 according to one embodiment of the invention. The interpolative circuit 110 in the frequency-domain includes a frequency combiner 310, a frequency sampler 332, a filter 320, a frequency gain amplifier 334, a frequency limiter 340, a phase shift 350, and a feedback gain amplifier 360.

The frequency combiner 310 is the frequency-domain equivalent of the multiplier (or multiplier/mixer) 210 in FIG. 2. The frequency sampler 332 is the frequency-domain equivalent of the sampler 232 in FIG. 2. Since sampling in the time-domain is the same as multiplying the signal with a train of impulses (or delta functions), the frequency-domain result is the convolution of the signal with the frequency-domain equivalent of the train of impulses. As known by persons skilled in the art, the frequency-domain equivalent of a train of impulses is also another train of impulses, and convolution of a train of impulses and a signal is the same as replicating the signal at the impulse locations. Therefore, the time-domain sampler 232 has the frequency-domain sampler equivalent 332.

The filter H(z) 320 is the frequency-domain equivalent of the BPF 220. Since sampling and filtering are commutative, the two operations can be exchanged. The frequency gain amplifier 334 is the frequency-domain equivalent of the metric generator 334 with a gain $K_f$, where $K_f$ has a dimension Volts/Hz, because the metric generator essentially generates a signal whose magnitude is indicative of the frequency of the input. The quantizer 340 is the frequency-domain equivalent of the quantizer 240. The delay element 350 is the frequency-domain equivalent of the delay element 250. The feedback gain amplifier 360 is the frequency-domain equivalent of the signal oscillator 260 because the signal oscillator 260 merely generates a signal having a frequency controlled by the amplitude of the sequence signal. Note that, when the digitizer is a 1-bit ADC (hard-limiter) for a first-order interpolative circuit, the performance is independent of $K_f$ due to hard-limiter 240 that follows the frequency detector 230.

The first-order interpolative circuit 110 in FIG. 3 functions in a similar manner to a traditional first-order sigma-delta loop circuit that operates on the amplitude of its input signal. The main difference is the presence of the lowpass filter that replaces the ideal integrator. The interpolative nature of the system on the digitized instantaneous frequency can easily be observed using the well unknown operating principles of sigma-delta encoders. Thus the output quantization noise spectrum is shaped to have a high pass spectrum and the hard-limiter 240 output and can efficiently be filtered by the decimator 120. The advantage of current method of frequency digitization then becomes evident. The distortion components are at higher frequencies and they can be easily filtered out. This yields high quality digitization.

FIGS. 4A through 4D show plots of loop signals and parameters that are obtained from a simulation of the system 100 using the first-order interpolative circuit 110 shown in FIG. 2. The system is implemented with a one-bit ADC.

The input signal r(t) to the system is a unity magnitude, Gaussian Minimum Shift Keying (GMSK) signal which is similar to the GMSK signal of the Global System for Mobile Communications (GSM). That is, the modulation constant of the modulation is BT=0.3, and the maximum frequency deviation of the input signal is 67.7 KHz. The system parameter are chosen as: $f_c$=22.5 MHz, $f_2$=16 MHz, $f_s$=26 MHz, BPF bandwidth (BW)=100 KHz (one sided bandwidth around the center frequency), $K_v$=70,000 and the decimator filter bandwidth of 150 KHz. The BPF is chosen to have a 4th order Butterworth characteristic (2nd order low pass equivalent). The decimation filter LPF is chosen to have a 8th order Butterworth characteristics with 3 dB bandwidth of 150 KHz. The simulation uses a simple approximate frequency detector that will be described later.

In FIG. 4, the system variables for a 0.1 msec time interval are plotted. FIG. 4A is a diagram illustration of an instantaneous frequency function m(t). FIG. 4B is a diagram illustration of an output of a decimator for a simulated first-order interpolative circuit for $K_v$=70,000 according to one embodiment of the invention. FIG. 4C is a diagram illustration of an output of a frequency detector for a simulated first-order interpolative circuit for $K_v$=70,000 according to one embodiment of the invention. FIG. 4D is a diagram illustration of an output of a hard-limiter for a simulated first-order interpolative circuit for $K_v$=70,000 according to one embodiment of the invention.

Figure 4A:
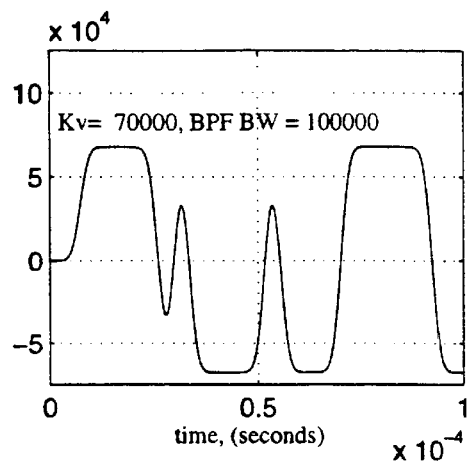
FIG. 4A is a diagram illustration of an instantaneous frequency function m(t) of a simulated first-order interpolative circuit for Kv=70,000 according to one embodiment of the invention.
Figure 4C:
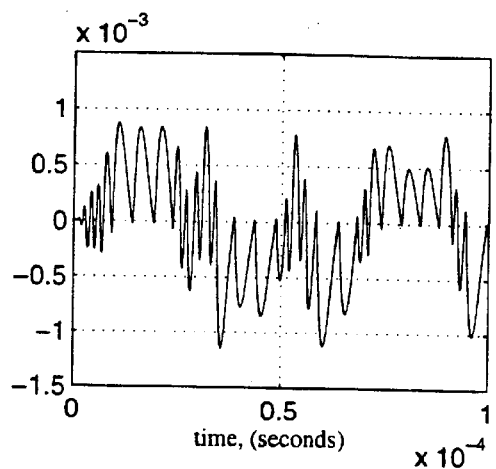
FIG. 4C is a diagram illustration of an output of a frequency detector for a simulated first-order interpolative circuit for Kv=70,000 according to one embodiment of the invention.
Figure 4B:
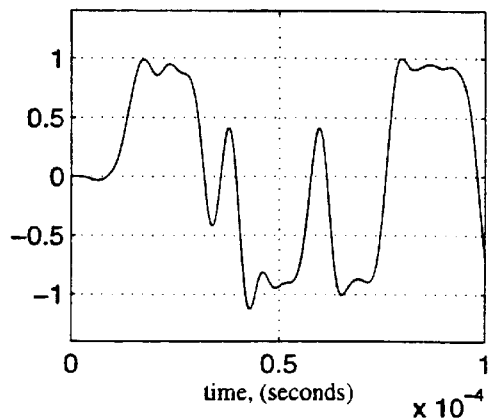
FIG. 4B is a diagram illustration of an output of a decimator for a simulated first-order interpolative circuit for Kv=70,000 according to one embodiment of the invention.
Figure 4D:
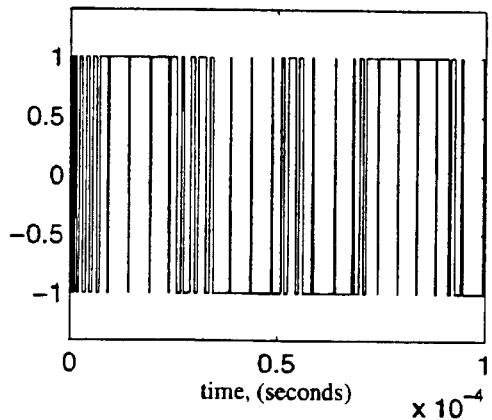
FIG. 4D is a diagram illustration of an output of a hard-limiter for a simulated first-order interpolative circuit for Kv=70,000 according to one embodiment of the invention.

From FIG. 4C and FIG. 4D, the interpolative nature of the system is easily observable. When m(t) is positive, it is seen from FIG. 4D that the positive values of p(t) is more likely, and, when m(t) is negative, negative values of p(t) is more likely. Thus, the circuit tries to approximate the input signal frequency with average frequency of a sequence of high and low frequencies. The frequency integration functionality of the BPF can be seen from FIGS. 4A, 4C, and 4D. Consider the time interval in FIG. 4A where the input signal frequency remains negative for an extended interval (from 0.035 msec to 0.045 msec). In this time interval, the instantaneous frequency of the BPF output (FIG. 4C) is mostly negative. A negative instantaneous frequency reading at the frequency detector output yields a −1 at the output of the hard-limiter, which, in turn, causes VCO output to its lower frequency, flow. This lower frequency causes an increase at the multiplier/ mixer output at the multiplier/ mixer. Due to subtraction of frequencies by the multiplication operation, and, due to frequency integration operation of the BPF, the output instantaneous frequency of the BPF increases. When the instantaneous frequency reading of the frequency detector becomes slightly positive, a sequence of +1's are generated at the output of the hard-limiter, which, in turn, forces the VCO output frequency to its higher value $f_{high}$. However, a positive swing of the VCO output combined with the frequency subtraction of the multiplier, and integration by the BPF drives the BPF output back to negative values. Similar line of reasoning applies to the other scenarios of input frequency.

In order to be able to represent the input signal frequency range satisfactorily over the whole range of possible input frequencies, one has to choose $K_v$ to be greater than the maximum possible frequency variation of the input signal. This is the case illustrated in FIGS. 4A–4D. However, in some applications it is possible to use a value lower than the maximum possible variation of the input signal frequency. With such $K_v$, only frequencies less than $K_v$ can be represented satisfactorily by averaging the VCO output frequency. The system output frequency will saturate to its maximum possible value for an input signal frequency greater than $K_v$. In an application in which only the sign of the instantaneous frequency rather than the precise value of the instantaneous frequency is of interest, the usage of small $K_v$ is permissible.

Figure 5A:
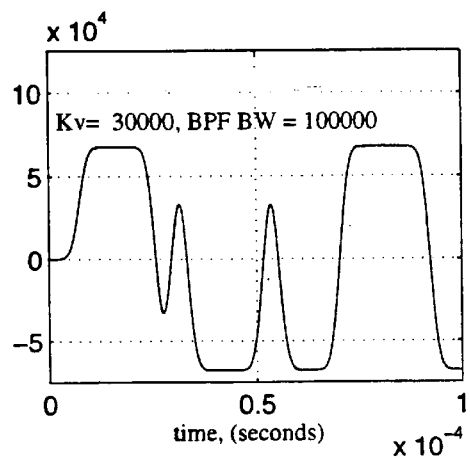
FIG. 5A is a diagram illustration of an instantaneous frequency function m(t) of a simulated first-order interpolative circuit for Kv=30,000 according to one embodiment of the invention.
Figure 5B:
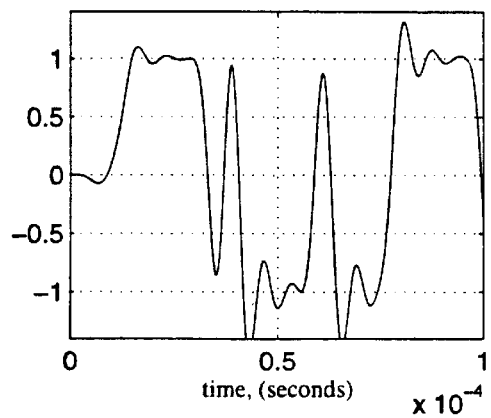
FIG. 5B is a diagram illustration of an output of a decimator for a simulated first-order interpolative circuit for Kv=30,000 according to one embodiment of the invention.
Figure 5C:
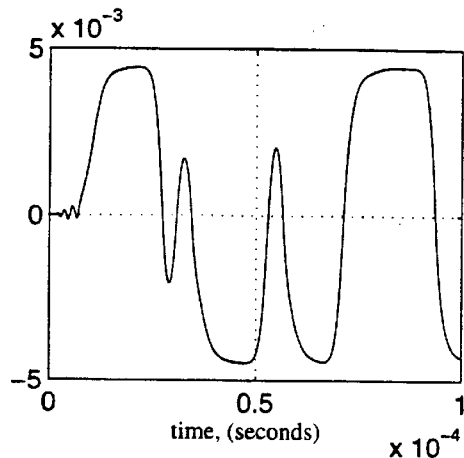
FIG. 5C is a diagram illustration of an output of a frequency detector for a simulated first-order interpolative circuit for Kv=30,000 according to one embodiment of the invention.
Figure 5D:
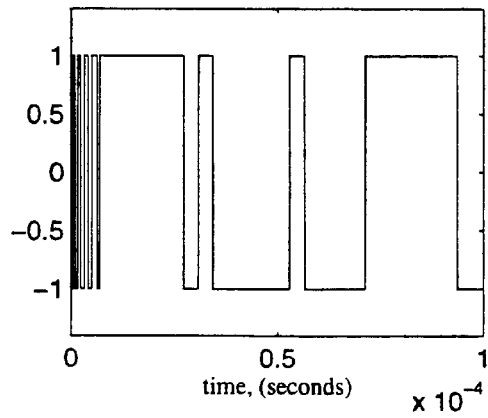
FIG. 5D is a diagram illustration of an output of a hard-limiter for a simulated first-order interpolative circuit for Kv=30,000 according to one embodiment of the invention.

FIGS. 5A–5D show the same set of system signals and variables in FIG. 4 for $K_v$=30,000. FIG. 5A is a diagram illustration of an instantaneous frequency function m(t). FIG. 5B is a diagram illustration of an output of a decimator for a simulated first-order interpolative circuit for $K_v$=30,000 according to one embodiment of the invention. FIG. 5C is a diagram illustration of an output of a frequency detector for a simulated first-order interpolative circuit for $K_v$=30,000 according to one embodiment of the invention. FIG. 5D is a diagram illustration of an output of a hard-limiter for a simulated first-order interpolative circuit for $K_v$=30,000 according to one embodiment of the invention.

The saturation of the output signal frequency is visible from FIG. 5C and FIG. 5D. As the input frequency m(t) changes in time, only the sections that are in the range of [−30 KHz, 30 KHz] can be constructed satisfactorily. For m(t) out of this range, the output assumes its positive or negative maximum level depending on the sign of m(t). As a result, the output signal from the system as seen in FIG. 5D is similar to a hard limited representation of the input instantaneous frequency shown in FIG. 5A.

Second-Order Interpolative Circuit

Figure 6:
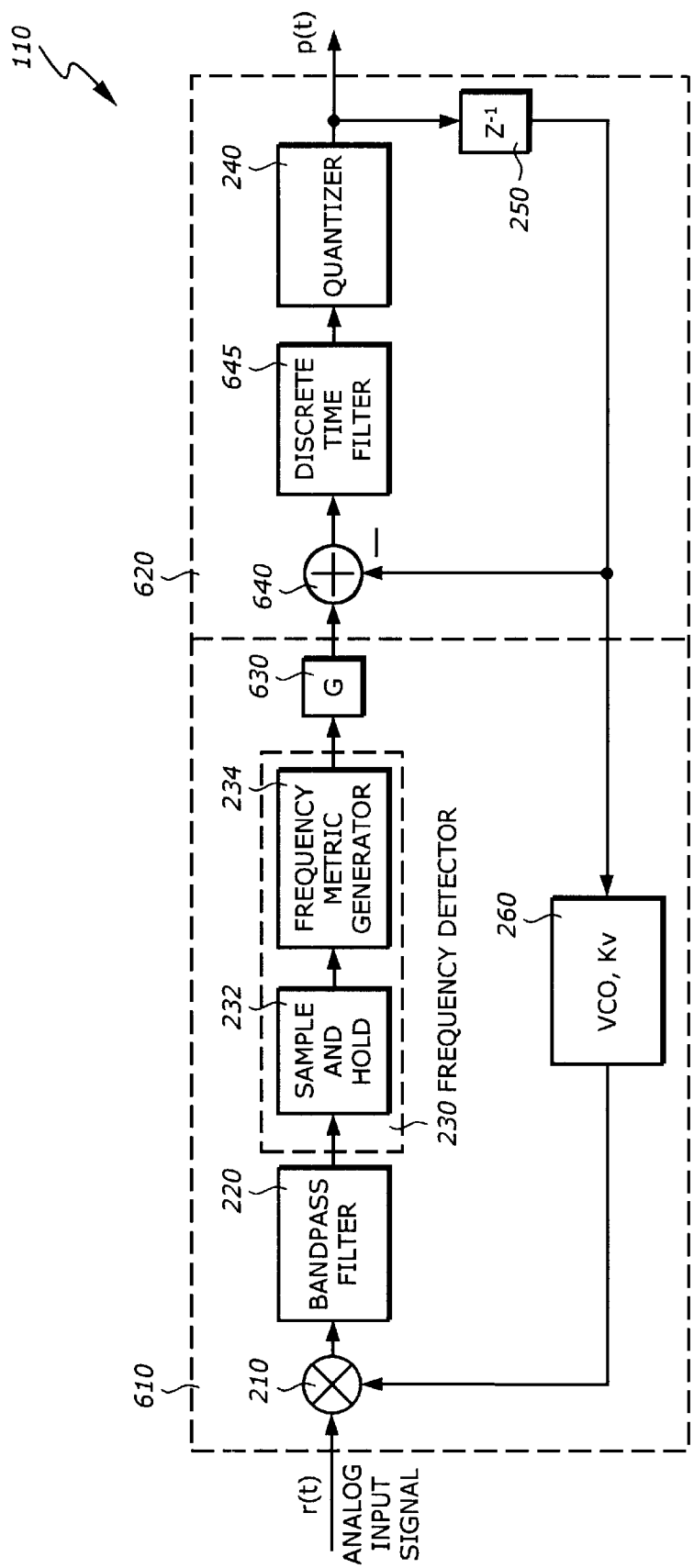
FIG. 6 is a diagram illustration of a second-order interpolative circuit 110 in the time-domain according to one embodiment of the invention.

FIG. 6 is a diagram illustration of a second-order interpolative circuit 110 according to one embodiment of the invention. The second-order interpolative circuit 110 includes a first loop circuit 610 and a second loop circuit 620 connected in cascade.

The first loop circuit (or the outer loop) 610 includes the multiplier 210, the BPF 220, the frequency detector 230, a scaler 630, and the signal oscillator 260. The multiplier 210, the BPF 220, the frequency detector 230, and the signal oscillator 260 are essentially the same as in FIG. 2. The scaler G 630 scales the metric signal generated by the frequency detector 230 to make it compatible with the second loop circuit 620.

As in FIG. 2, the output of the signal oscillator 260 is multiplied with the analog input signal r(t). The output of the multiplier/mixer is first passed through a bandpass filter (BPF) 220. The BPF 220 removes the sum frequency at the multiplier/mixer output. It also acts as an approximate frequency-domain low pass averaging filter. That is the instantaneous frequency of the BPF output is averaged version of the instantaneous frequency of its input signal. Thus, effectively, the bandpass filter output can be thought as a single frequency signal whose frequency is time weighted average of the instantaneous frequencies of the input signals. A fundamental difference between the first and second order loops can be seen here. The rate of changes of a second order loop is much faster than the time constant of the BPF. Thus, the BPF can only react to average of the input signal to it. However, in a first order loop the change rate of the quantizer is in the order of time constants of the BPF. Thus the BPF acts as an integrator.

The BPF output frequency is measured by the frequency detector 230. The frequency detector 230 output is scaled by the scaler 630 having a scale factor of G to bring its range to appropriate level for high quality encoding of the inner loop first-order sigma-delta encoder. If the frequency detector gain $K_f$ (in Volts/Hz) is very small, the detector output may be too small for high quality quantization. The input signal level should be placed appropriately within the dynamic range of the inner loop. This necessary scaling is performed by the scaler 630.

The second loop circuit (the inner loop) 620 takes its input from the scaled frequency detector output 630. The output of the second loop circuit 620 is the hard-limited output p(t). The second loop circuit 620 operates on the amplitude of its input in the classical manner of first-order sigma-delta loops (i.e. it operates on the "amplitude domain"). The loop input is encoded coarsely into a sequence of +1's and −1's, in an oversampled fashion in one embodiment of the invention. In general encoding can be done with a multi-bit digitizer.

The discrete-time filter 645 within the second loop circuit 620 is typically implemented as a discrete-time integrator.

The second loop circuit 620 includes a combiner 640, a discrete-time filter 645, the hard-limiter 250, and a delay element 250.

The output of the second loop circuit is also fed back to the first loop circuit 610, and it also modulates the signal oscillator output frequency. The coarsely encoded sequence is then interpolated by the decimator 120 to yield a precise estimate of the loop input r(t).

FIGS. 7A–7D show some of the signals and parameters of the variables of operation of the second-order interpolative circuit 110. The ADC used is a 1-bit ADC (or, hard limiter). The input signals that are used are the same as those used for earlier figures for explaining the operation of the first-order interpolative circuit. That is, the signal is modulated with Gaussian Minimum Shift Keying (GMSK) with a modulation constant BT=0.3, and the maximum frequency deviation of the input signal is 67.7 KHz. The system parameter are chosen as: $f_c$=22.5 MHz, $f_2$=16 MHz, $f_s$=26 MHz, G=120, BPF bandwidth (BW)=100 KHz (i.e., one sided bandwidth around the center frequency), $K_v$=70,000, and the decimator filter bandwidth is 150 KHz. The BPF is chosen to have a 4th order Butterworth characteristic (2nd order low pass equivalent). The decimation filter LPF in the decimator 120 is chosen to have an 8th order Butterworth characteristics. The frequency detector 230 is a simple approximate frequency detector that will be described later. The frequency detector gain is $K_f$=1.2×10$^{-7}$ Volts/Hz.

Figure 7A:
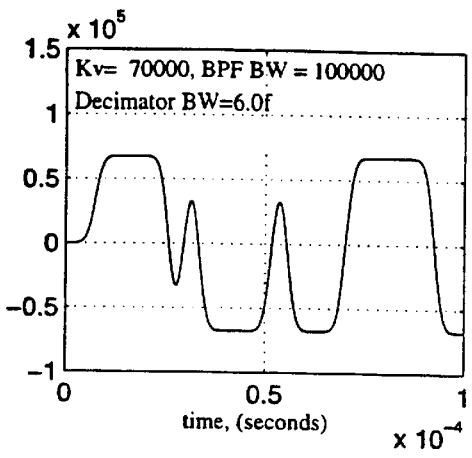
FIG. 7A is a diagram illustration of an instantaneous frequency function m(t) of a simulated second-order interpolative circuit for Kv=70,000 according to one embodiment of the invention.
Figure 7C:
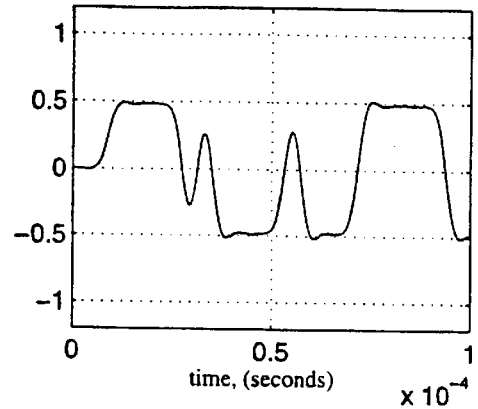
FIG. 7C is a diagram illustration of an output of a frequency detector for a simulated second-order interpolative circuit for Kv=70,000 according to one embodiment of the invention.
Figure 7B:
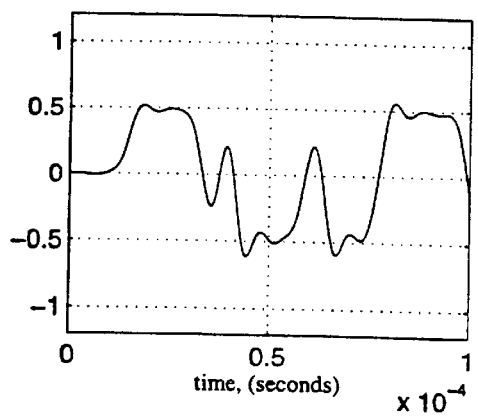
FIG. 7B is a diagram illustration of an output of a decimator for a simulated second-order interpolative circuit for Kv=70,000 according to one embodiment of the invention.
Figure 7D:
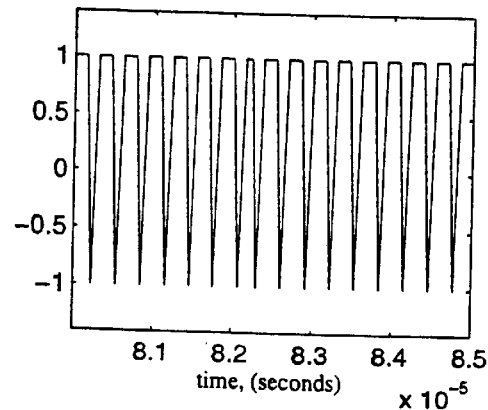
FIG. 7D is a diagram illustration of an output of a hard-limiter for a simulated second-order interpolative circuit for Kv=70,000 according to one embodiment of the invention.

FIG. 7A is a diagram illustration of an instantaneous frequency function m(t). FIG. 7B is a diagram illustration of an output of a decimator for a simulated second-order interpolative circuit for $K_v$=70,000 according to one embodiment of the invention. FIG. 7C is a diagram illustration of an output of a frequency detector for a simulated second-order interpolative circuit for $K_v$=70,000 according to one embodiment of the invention. FIG. 7D is a diagram illustration of an output of the hard-limiter for a simulated second-order interpolative circuit for $K_v$=70,000 according to one embodiment of the invention. In FIG. 7D, the one bit output of the second loop circuit 620 for the time interval [8×10$^{-5}$ to 8.5×10$^5$ second] is shown. In this time interval the input instantaneous frequency is at its positive maximum of 67.7 KHz.

There is a fundamental difference in the operation of first and second order loops. This can be seen from the behavior of the frequency detector output as shown in FIG. 7C is different from that observed for the first-order interpolative circuit shown in FIG. 2. The integration functionality is no longer visible although it is still performed by the BPF. The reason for this is as follows: The second loop circuit 620 encodes the scaled output of the frequency detector. This loop operates with a very high sampling frequency. Thus, the rate of sign reversals of the one bit output is in the order of sampling rate. The positive and negative swings of hard-limiter output is mapped to positive and negative frequency swings around the VCO center frequency. The VCO output is multiplied with the input signal by the multiplier/mixer. Also, the sampling frequency used in the system is much higher that the maximum frequency spread of the input signal instantaneous frequency, m(t).

This implies that the instantaneous frequency of the input signal changes much more slowly compared to the sampling rate. Thus, at the multiplier output, the difference frequency component varies between $f_c+m(t)-f_2-K_v$, and, $f_c+m(t)-f_2+K_v$. For the case for which the simulation results presented, the values of the simulation parameters are: BPF BW=100,000 and sampling frequency is $f_s$=26 MHz. Thus, the time constants of the BPF is much larger compared to the period of the 26 MHz clock with which the hard-limiter output is controlled. The BPF cannot respond rapidly to changes of p(t) but it can only track time weighted average frequency of the input signal. Since the BPF 220 cannot respond to the rapid changes of p(t), the effects of high and low swings of p(t) are not visible at the BPF output.

For the first-order interpolative circuit as shown in FIG. 2, the output of the frequency detector 230 is fed directly back through the hard-limiter 240 and the signal oscillator 260. There is no independent high speed digitizer that works on the frequency detector output as in the case of second-order interpolative circuit shown in FIG. 6. For a first-order interpolative circuit in FIG. 2, the rate of change between positive and negative swings of the one bit output are directly determined by the rate of change of the BPF output which is much slower compared to the sampling rate. The positive and negative swings of the hard-limiter are mapped to positive and negative frequency swings by the signal oscillator 260 and multiplied with the analog input signal by the multiplier/mixer 210. Since the changes at the hard-limiter 240 occur with a time constant in the order of the time constant of the BPF, the input signal to the BPF that is fed back through the signal oscillator 260 and the multiplexer/mixer 210 change with a time constant in the order of the time constant of the BPF 220. Thus the BPF integration operation is visible for a first-order interpolative circuit of FIG. 2.

It is possible to decrease the loop time constants by increasing the bandwidth of the BPF 220. For a second-order interpolative circuit of FIG. 6, the second loop circuit will then start acting more like the outer loop of a second-order sigma-delta loop rather than being a very slow loop compared to the inner loop.

A second-order interpolative circuit has a wider dynamic range than the first-order interpolative circuit. The reason for this is the increased sampling frequency with which the inner loop output is digitized in a second-order loop. Increased sampling frequency improves the quality of approximation of the instantaneous frequency through averaging of 1-bit digital samples. It also brings the capability of quantizing small values of instantaneous frequency. The reason for this is quantizing small values requires averaging larger number of 1-bit digital samples.

Figure 8:
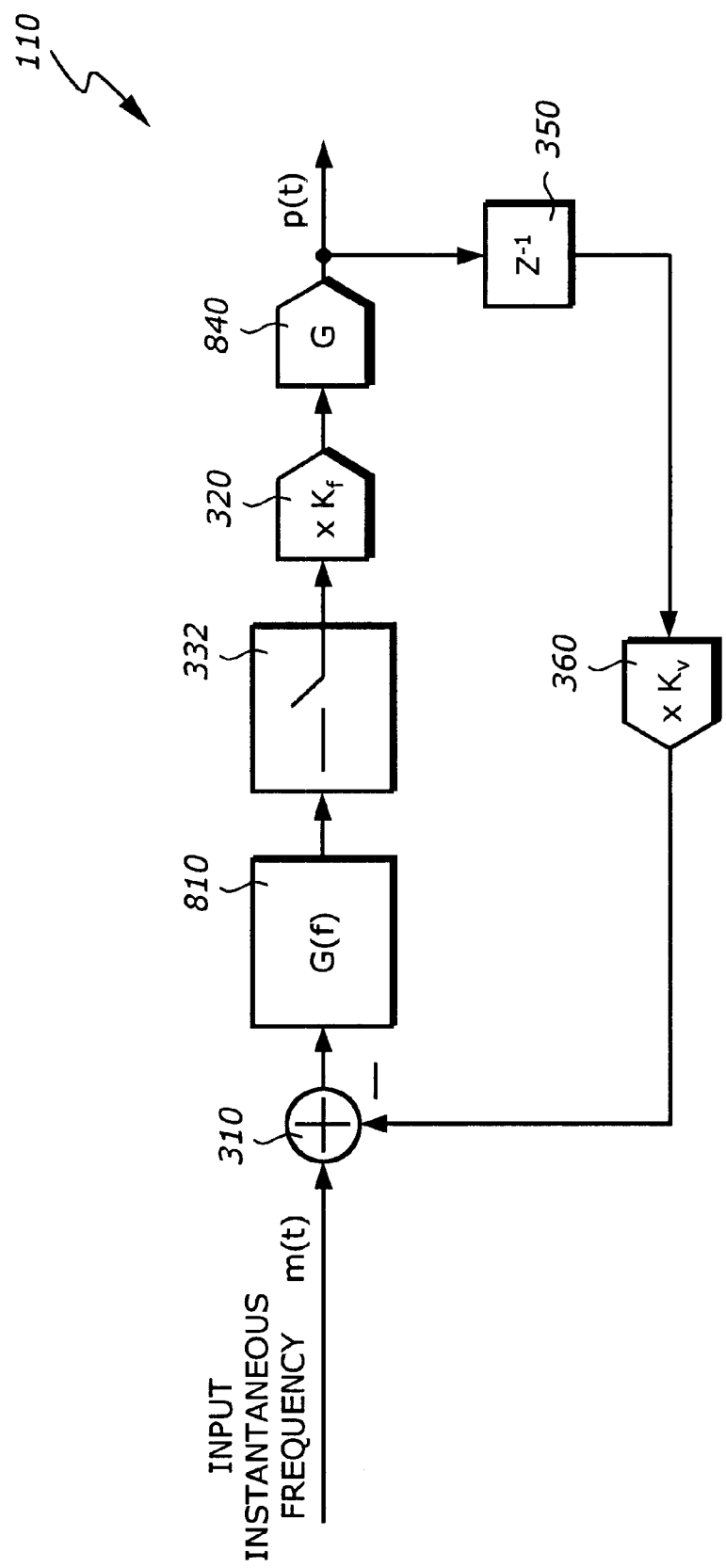
FIG. 8 is a diagram illustration of a second-order interpolative circuit 110 in the frequency-domain according to one embodiment of the invention.

FIG. 8 is a frequency domain model of a second-order interpolative circuit 110 according to one embodiment of the invention. The frequency-domain second-order interpolative circuit 110 includes the frequency combiner 310, a frequency domain low pass filter function G(f), a frequency sampler 332, the frequency gain amplifier 320, a frequency scaler 840, the delay element 350, and the feedback gain amplifier 360. For clarity, only the relevant elements are shown.

The frequency combiner 310, the frequency sampler 332, the frequency gain amplifier 320, the delay element 350, and the feedback gain amplifier 360 operate in the same manner as the corresponding elements shown in FIG. 3. The frequency scaler 840 essentially provides a scaling of the magnitude of the frequency detector.

The transfer function for this circuit is given as:

$$\frac{S(z)}{M(z)} = \frac{GK_f}{1 + GK_f K_v z^{-1}} \quad (3)$$

Where S(z) and M(z) are z transforms of s(t) and m(t), respectively.

In order to see the validity and accuracy of the model, consider the steady state value of Vo(t) for m(t)=67.7 KHz. We will compare the obtained value with these obtained from simulations that is presented in FIG. 7. Using m(t)= 67.7 KHz, $z^{-1}$=1 (for steady state), $K_f$=1.2×10$^{-7}$ volts/Hz, $K_v$=70,000, G=120, then Vo(t)=0.502 V. This is what is observed for the decimator output signal during the time intervals where the input signal frequency, m(t) is 67.7 KHz. Thus the model is verified for the case of m(t) being a constant signal since simulation results match with analytical results.

Denote the maximum frequency deviation of the input signal as $f_{max}$. For successful operation of the second-order system it is not required to have $K_v < f_{max}$. Without this condition being true, the circuit can still track and construct the instantaneous frequency waveform without and saturation effects if the following condition is satisfied:

$$S_{max} = \frac{Gk_f}{1 + Gk_f k_v z^{-1}} f_{max} < 1 \quad (4)$$

Note that this is actually a condition for the maximum input level for the input of the inner loop. Clearly, with a hard-limiter of minimum and maximum levels of −1 and +1, respectively, for operation of the inner loop without any saturation, its input level should be in the interval [−1, +1].

PREDICTIVE FEEDBACK CIRCUITS

Predictive feedback systems operate with a different principle compared to the interpolative schemes described earlier. These systems employ a feedback loop that constructs a precise estimate of the input signal frequency rather than a coarse estimate as in the case of interpolative circuits.

Figure 9:
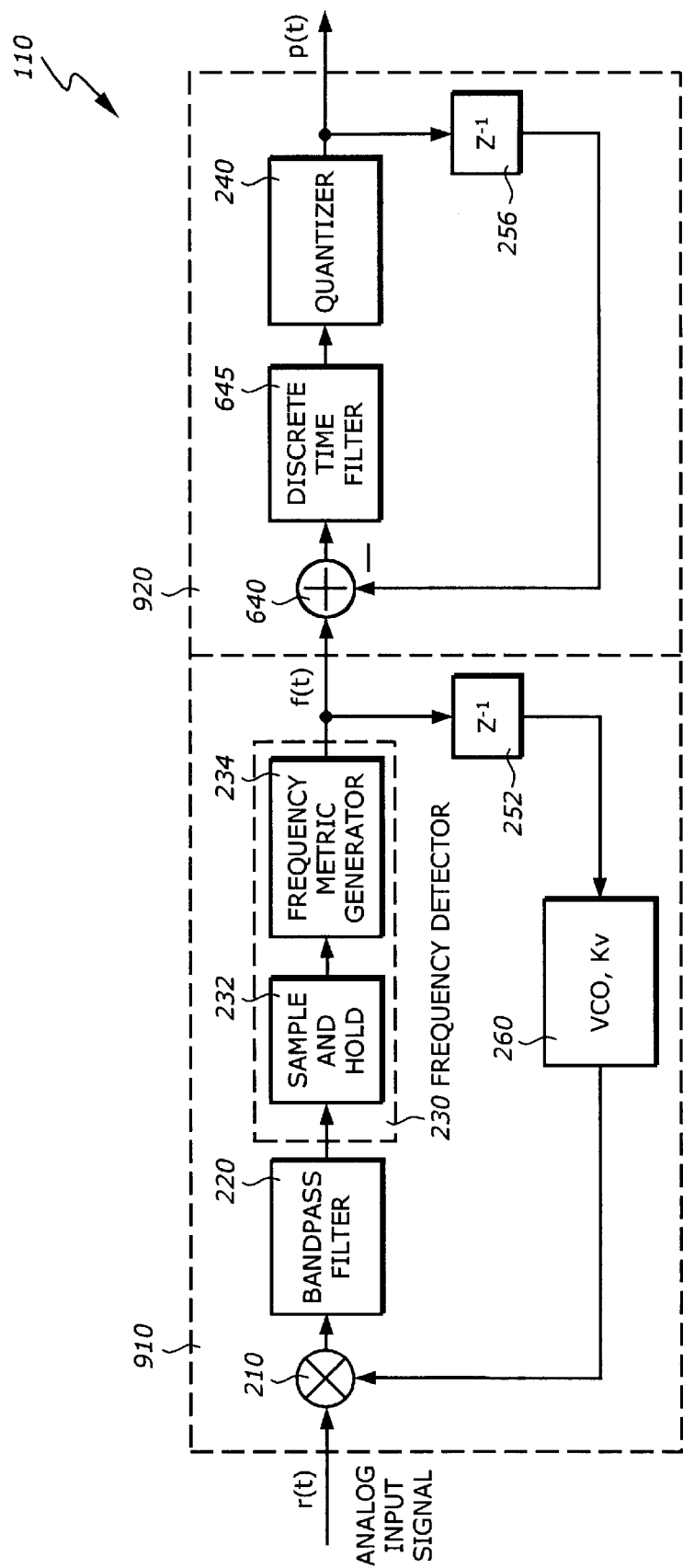
FIG. 9 is a diagram illustration of a cascaded-loop predictive circuit 110 according to one embodiment of the invention.
Figure 10:
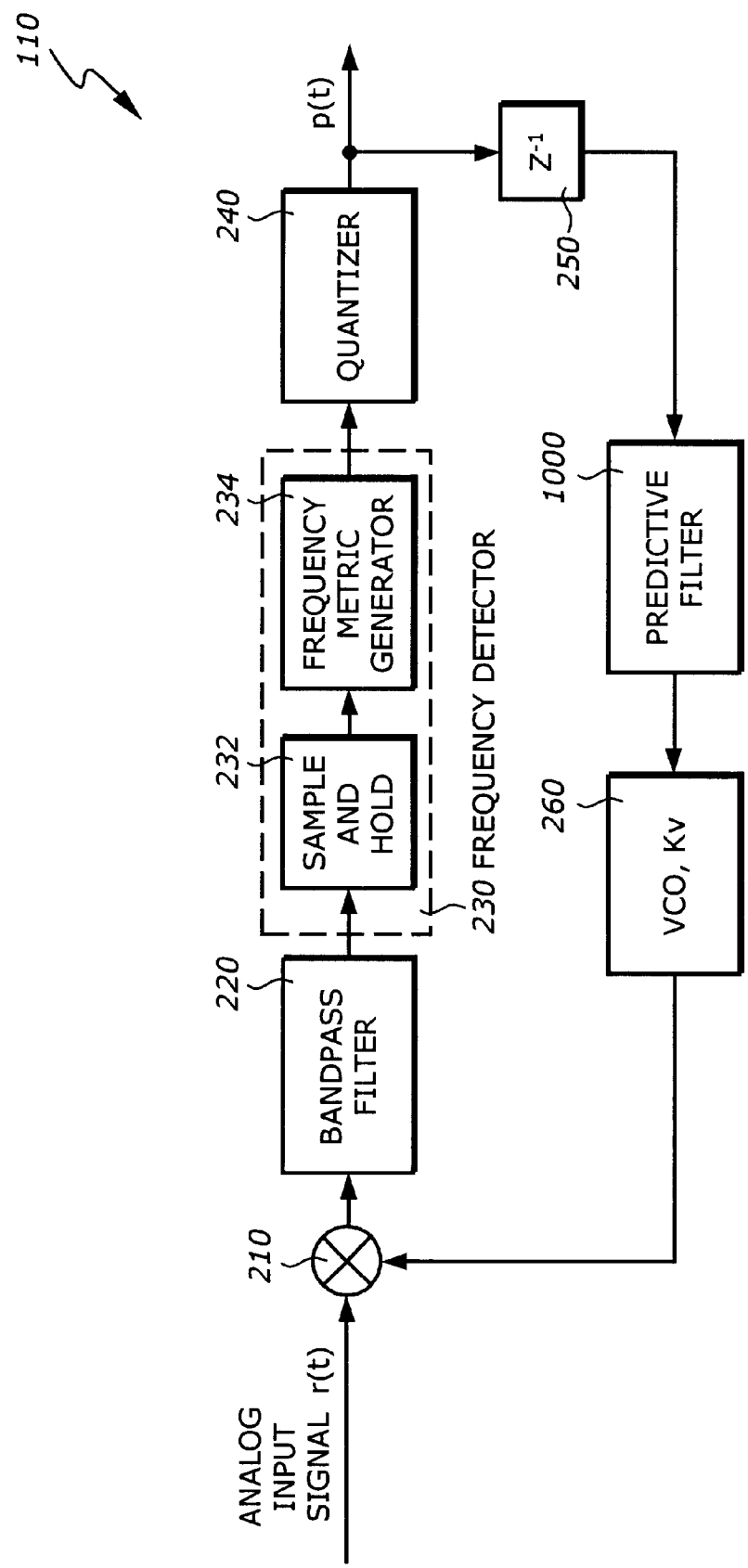
FIG. 10 is a diagram illustration of a single loop predictive circuit 110 according to one embodiment of the invention.

It is possible to construct predictive structures as shown in FIG. 9 and FIG. 10.

FIG. 9 is a diagram illustration of a cascaded-loop predictive circuit 110 according to one embodiment of the invention. The cascaded-loop predictive circuit 110 includes a first loop circuit 910 and a second loop circuit 920.

The first loop circuit 910 provides an analog estimate of the input instantaneous frequency. The output of the first loop circuit 910, f(t), is digitized. In the embodiment shown the second loop circuit 920 is a first-order 1-bit sigma-delta encoder to generate the sequence signal p(t). The sigma-delta encoder can also be constructed as a higher order loop rather than being a simple first-order loop. Any method of converting the output of the first circuit is applicable.

The first loop circuit 910 includes the multiplier 210, the bandpass filter 220, the frequency detector 230, a delay element 252, and the signal oscillator 260. The multiplier 210, the bandpass filter 220, the frequency detector 230, and the signal oscillator 260 operate in the same manner as the corresponding elements in FIG. 2. The delay element 252 operates in the same manner as the delay element 250. The first loop circuit 910 generates the metric signal f(t).

The second loop circuit 920 includes a combiner 640, a discrete-time filter 645, a quantizer 240, and a delay element 256. The combiner 640 combines the metric signal f(t) generated by the first loop circuit 910 with the second feedback signal from the delay element 256 to generate an encoded signal. The discrete-time filter 645 filters the encoded signal to generate the filtered encoded signal which is hard-limited by the hard-limiter 240. The hard-limiter 240 generates the sequence signal p(t) which is fedback to the delay element 256. A multilevel quantizer is applicable in place of quantizer 240 in alternate embodiments.

FIG. 10 is a diagram illustration of a single loop predictive circuit 110 according to one embodiment of the invention. The single loop predictive circuit 110 includes the multiplier 210, the bandpass filter 220, the frequency detector 230, the hard-limiter 240, the delay element 250, a predictive filter 1000, and the signal oscillator 260.

The multiplier 210, the bandpass filter 220, the frequency detector 230, the hard-limiter 240, the delay element 250, and the signal oscillator 260 essentially operate in the same manner as the corresponding elements shown in FIG. 2. The predictive filter 1000 is a filter which predicts the next control signal based on the current control signal from the delayed sequence signal.

The single loop predictive circuit 110 shown in FIG. 10 is designed to perform instantaneous frequency extraction and digitization in a single step. In this system the loop circuit is designed such that the instantaneous frequency of the input signal is closely tracked by VCO output instantaneous frequency.

FREQUENCY DETECTOR

The frequency detector 230 shown in FIGS. 2, 6, 9, and 10 is an important element in the feedback circuit 110. There are a number of embodiments for the frequency detector 230.

Figure 11:
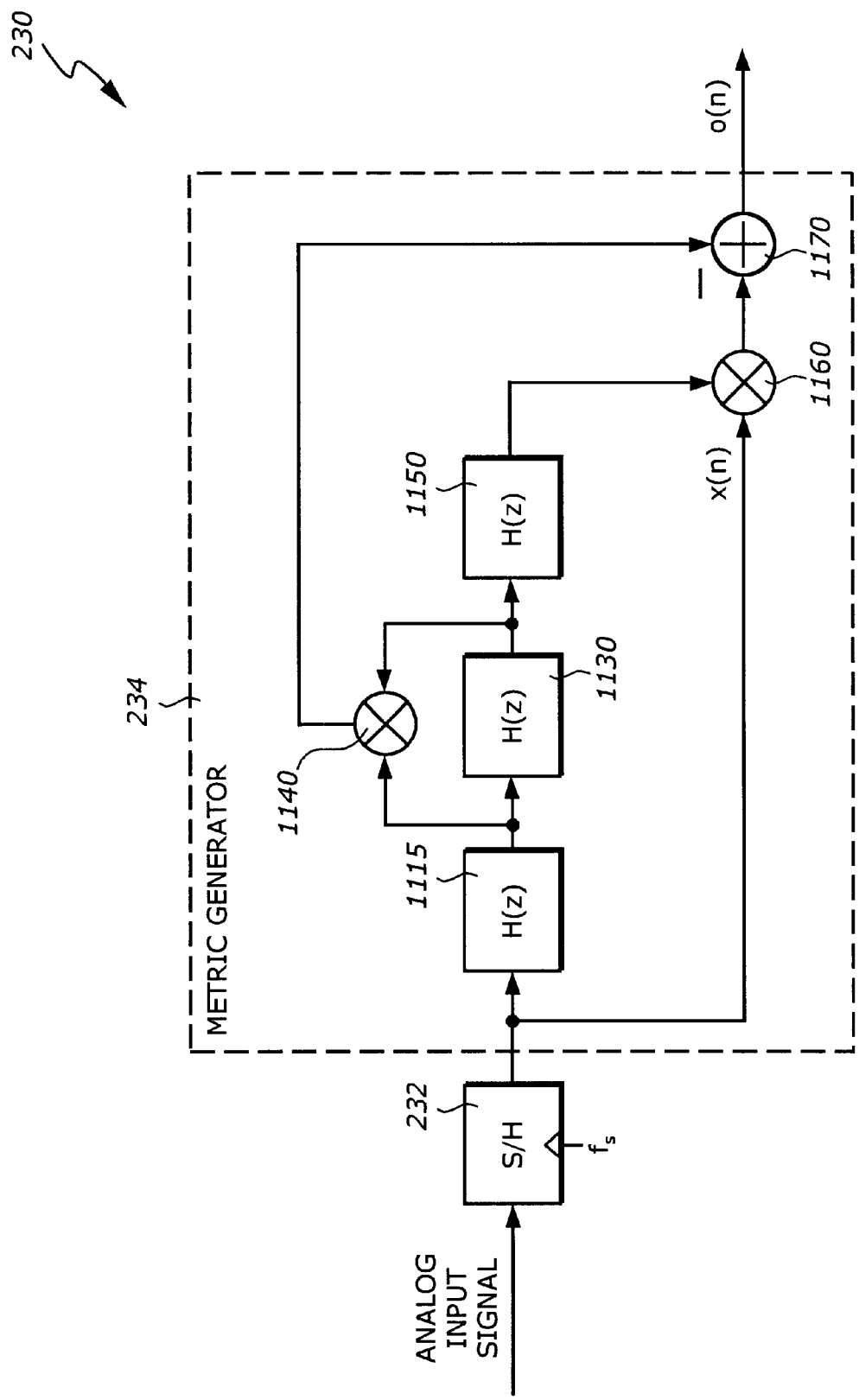
FIG. 11 is a diagram illustration of a frequency detector according to one embodiment of the invention.

FIG. 11 is a diagram illustration of a frequency detector 230 according to one embodiment of the invention. The embodiment of the frequency detector 230 in FIG. 11 is a simple and robust approximate frequency detector. First, the input signal is sampled with an appropriate sampling frequency $f_s$. These samples are processed to yield a frequency detector characteristics which yields a metric whose magnitude is proportional to the difference of the instantaneous frequency of the input signal and the carrier frequency of the input modulated signal.

The frequency detector 230 in FIG. 11 includes a sampler 232 and a metric generator 234. The metric generator 234 includes filters 1115, 1130, and 1150, multipliers 1140 and 1160, and a combiner 1170.

The sampler 232 is a sample-and-hold device that samples the analog signal with a sampling frequency $f_s$. In one embodiment, the sampling frequency $f_s$ is 4 times the carrier frequency. The filters 1115, 1130, and 1150 are any frequency-domain filters for discrete-time signals.

A method of obtaining a frequency detectors involves usage of delay elements in place of filters 1115, 1130, and 1150 in FIG. 11. Then the frequency detector equation is given as:

$$o(n) = x(n)*x(n-a) - x(n-b)*x(n-c) \quad (5)$$

The filter 1115 is a delay element which delays for b samples. The filter 1130 is a delay element which delays for d samples, where d=c−b. The filter 1150 is a delay element which delays for e samples, where e=a−b−d. In a simple embodiment, each of the filters 1115, 1130, and 1150 delays for one sample. The term "delays for K samples" refers to delaying for K clock periods, each clock period corresponding to the clock period of the sampling frequency $f_s$. The multiplier 1140 multiplies the two filtered signals from the filters 1115 and 1130 to generate a first product signal. The multiplier 1160 mutiplies the sampled signal x(n) with the filtered signal from the filter 1150 to generate a second product signal. The combiner 1170 is any circuit that combines the two product signals. In one embodiment, the combiner 1170 subtracts the first product signal from the second product signal to generate the metric signal.

Among the family of detector characteristics define by parameters a, b, and, c, a particular set of parameters yield relatively more desirable linear frequency detector characteristics. This set of parameters are given by a=3, b=2, c=1.

Figure 12:
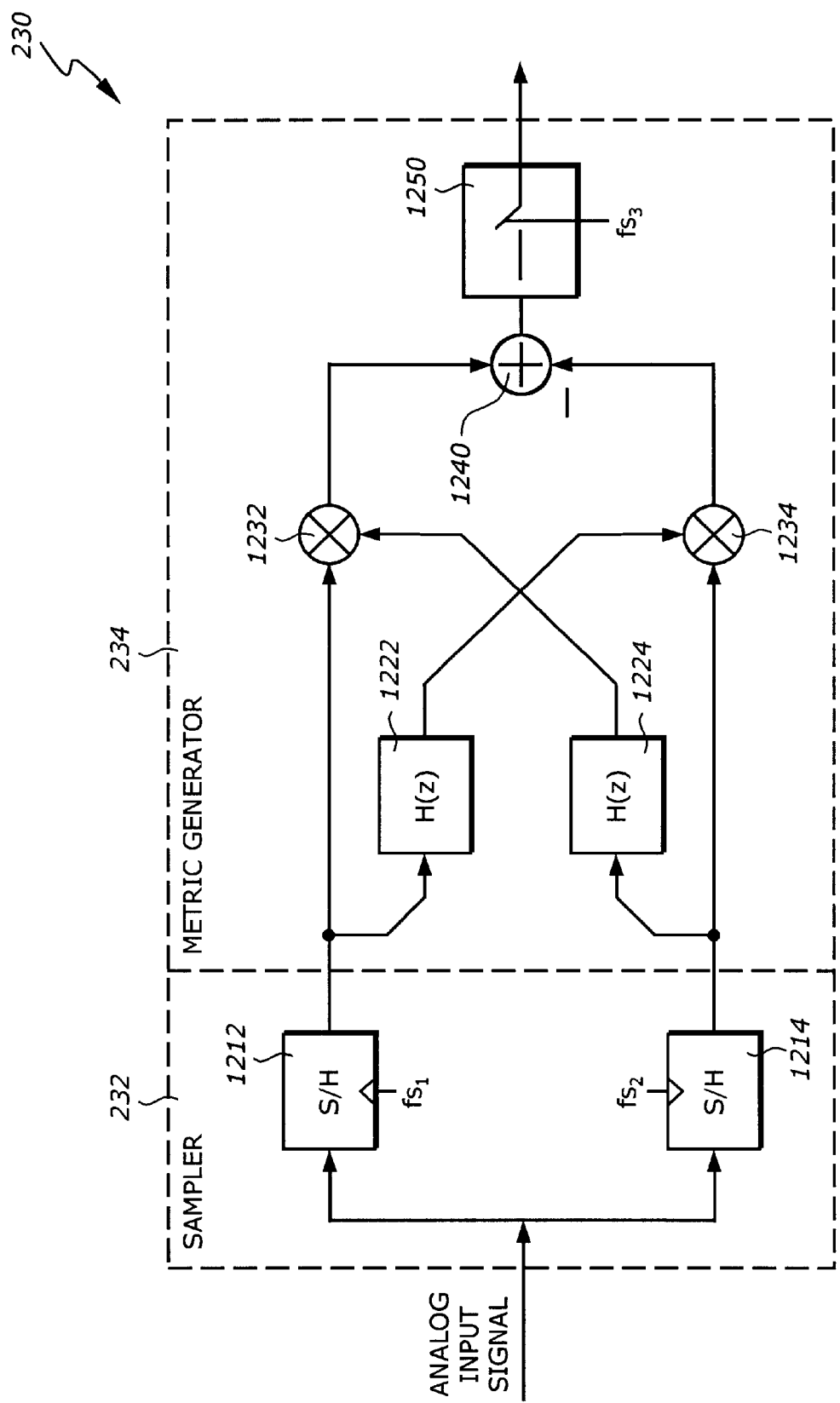
FIG. 12 is a diagram illustration of a frequency detector according to another embodiment of the invention.

FIG. 12 is a diagram illustration of a frequency detector 230 according to another embodiment of the invention. In this embodiment, the frequency detector 230 includes a sampler 232 and a metric generator 234. The sampler 232 includes two sample-and-hold devices 1212 and 1214. The metric generator 234 includes filters 1222 and 1224, multipliers 1232 and 1234, a combiner 1240, and a sampler 1250.

The sample-and-hold devices 1212 and 1214 sample the signal at the sampling frequencies $f_{s1}$ and $f_{s2}$, respectively. The sampling signals for both devices have the same frequency of f's which is 2 times the carrier frequency. The sampler 1212 samples at t=2nT where T is the sampling period, while the sampler 1214 samples at t=(2n+1)T.

Note that f's=fs/2 where fs=4$f_{IF}$. The sampling clocks are offset by T=1/$f_s$.

The filters 1222 and 1224 may have any filter characteristics. In one embodiment, the filter characteristics include delaying. The multiplier 1232 multiplies the sampled it signal from the sampler 1212 with the filtered signal from the filter 1224 to generate a first product signal. The multiplier 1234 multiplies the sampled signal from the sampler 1214 with the filtered signal from the filter 1222 to generate a second product signal. The combiner 1240 combines the two product signals to generate a combined signal which is sampled by the sampler 1250. The sampling frequency of the sampler 1250 is either the same or half as the sampling frequency of the samplers 1212 and 1214 as discussed below. In one embodiment, the combiner 1240 is a subtractor that subtracts the second product signal from the first product signal.

In order to obtain the frequency detector that implements the metric o(n) in (5), the H(z) is set to $Z^{-2}$ (where $Z^{-1}$ refers to a delay of one clock cycle), T=1/$f_s$). Note that the output of the combiner 1240 is sampled at every other clock cycle of the system clock that runs with frequency $f_s$. Thus, the update frequency of this frequency detector is at half of the update frequency of the circuit given in FIG. 11. At the output of the combiner 1240, the sign of the instantaneous frequency estimate toggles every clock cycle. If it is desired to sample the output at the same rate as the circuit shown in FIG. 11, then it is necessary to change the polarity of the combiner output every other sample, and also operate the sample-and-hold circuit at sampling frequency of $f_s$.

It is possible to choose H(z) in FIG. 12 in several different ways to shape the detector characteristics. Some examples of these are:

1. H(z)=$z^{-D}$, where D is a positive integer, i.e., the filter implements a delay function. In the special case of D=2, the circuit realizes the o(n) expression in (5).
2. H(z)=$(\alpha-z^{-1})/(1-\alpha z^{-1})$, which represents a generalized delay element.

The implementation of the frequency detector in FIG. 12 with H(z)=$Z^{-2}$ yields a simple implementation of the metric given in (5).

By choosing H(z) appropriately, the frequency detector can be designed to be linear over a wide range of frequencies, or, designed to have nulls at certain desired frequencies. Placing nulls at certain frequencies can be used in cases where it is desired to eliminate undesired signals, such as Adjacent Channel Interference (ACI) Signals in Cellular Mobile Communications.

The frequency detector 230 shown in FIG. 12 provides a frequency measurement that is related to input signal magnitude. The output measurement is directly proportional to the square of the input signal magnitude. An Automatic Gain Control (AGC) system that normalizes the input signal at the system input may be utilized to set the input signal to desired signal level. The AGC gain value, in combination with the magnitude of the digitizer output can be used to yield a precise readout of the instantaneous frequency of the input signal.

Since the frequency detector output is directly proportional to the square of the input signal magnitude, for small input signal magnitude signals, the frequency detector output may be very small. This may reduce the digitizer performance since there is a finite dynamic range of the digitizer and very small magnitude signals are not converted with high precision if noise and circuit imperfections are considered.

One is usually interested in the response of a frequency detector to a single sinusoidal signal. However, in many cases including Cellular Mobile Communications, there are more than one constant magnitude, frequency/phase modulated signals at the input of the receiver. A typical example of this is the case where the receiver is exposed to an Adjacent Channel Interference (ACI). The interference is due to a transmitter that is using an adjacent frequency band. In order to be able to analyze system behavior in the presence of an interferer of such characteristics it is necessary to characterize response of the frequency detector to two sine waves.

Specifically, for a GSM system, the GMSK signal can be thought as a sine wave whose instantaneous frequency varies between +67 KHz and −67 KHz (approximately) based on the value of the precoded data sequence. Similarly, an adjacent channel interferer (ACI) is another sine wave whose instantaneous frequency varies centered around its center frequency. For example for an ACI located at one higher band (200 KHz offset) the instantaneous frequency varies between 133 KHz and 267 KHz.

In what follows, the response of the frequency detector to two sine wave signals at its input is derived. Results for a single sine wave follow by setting the amplitude of the second sine wave to zero. Let the input signal to the detector be:

$$i(t)=s_1(t)+s_2(t) \qquad (6)$$

$$\text{where } s_1(t)=A_1\cos[2\pi(f_c+f_1)t], \text{ and} \qquad (7)$$

$$s_2(t)=A_2\cos[2\pi(f_c+f_2)t] \qquad (8)$$

Then the output is given as $$o(m) = S_1 + S_2 \frac{A_1 A_2}{2}[\alpha_1 \sin(x_1) + \beta_1 \cos(x_1) + \alpha_2 \sin(x_2) + \beta_2 \cos(x_2)] \qquad (9)$$

where:

$$S_1 = \frac{A_1^2}{2}\sin(2\pi f_1 3T) + \frac{A_1^2}{2}\sin(2\pi f_1 T) \quad (10)$$

$$S_2 = \frac{A_2^2}{2}\sin(2\pi f_2 3T) + \frac{A_2^2}{2}\sin(2\pi f_2 T) \quad (11)$$

$$x_1 = 2\pi(f_1 + f_2)2mT \quad (12)$$

$$x_2 = 2\pi(f_1 + f_2)2mT \quad (13)$$

$$\alpha_1 = -\cos(2\pi f_2 3T) - \cos(2\pi f_1 3T) + \cos(2\pi f_1 T + 2\pi f_2 2T) + \cos(2\pi f_2 T + 2\pi f_1 2T) \quad (14)$$

$$\beta_1 = \sin(2\pi f_2 3T) + \sin(2\pi f_1 3T) - \sin(2\pi f_1 T + 2\pi f_2 2T) - \sin(2\pi f_2 T + 2\pi f_1 2T) \quad (15)$$

$$\alpha_2 = \cos(2\pi f_2 3T) - \cos(2\pi f_1 3T) + \cos(2\pi f_1 T - 2\pi f_2 2T) - \cos(2\pi f_2 T + 2\pi f_1 2T) \quad (16)$$

$$\beta_2 = \sin(2\pi f_2 3T) + \sin(2\pi f_1 3T) - \sin(2\pi f_1 T - 2\pi f_2 2T) - \sin(2\pi f_2 T - 2\pi f_1 2T) \quad (17)$$

If there is a single sine wave at the receiver input, then $A_2 = 0$ and the output is given as:

$$o(m) = S_1 = A_1^2/2 \sin(2\pi f_1 3T) + A_1^2/2 \sin(2\pi f_1 T) \quad (18)$$

Choose $2\pi f_1 T \ll 1$. Then, since, $\sin(x) \approx x$ for small x:

$$o(m) = A_1^2/2 \; 2\pi 4 T f_1 \quad (19)$$

The above expression shows that the output o(m) is a function of the input signal frequency $f_1$. Note that the frequency estimate is dependent on the square of input signal sine wave amplitude. For exact frequency detection, knowledge of signal amplitude is necessary.

Figure 13:
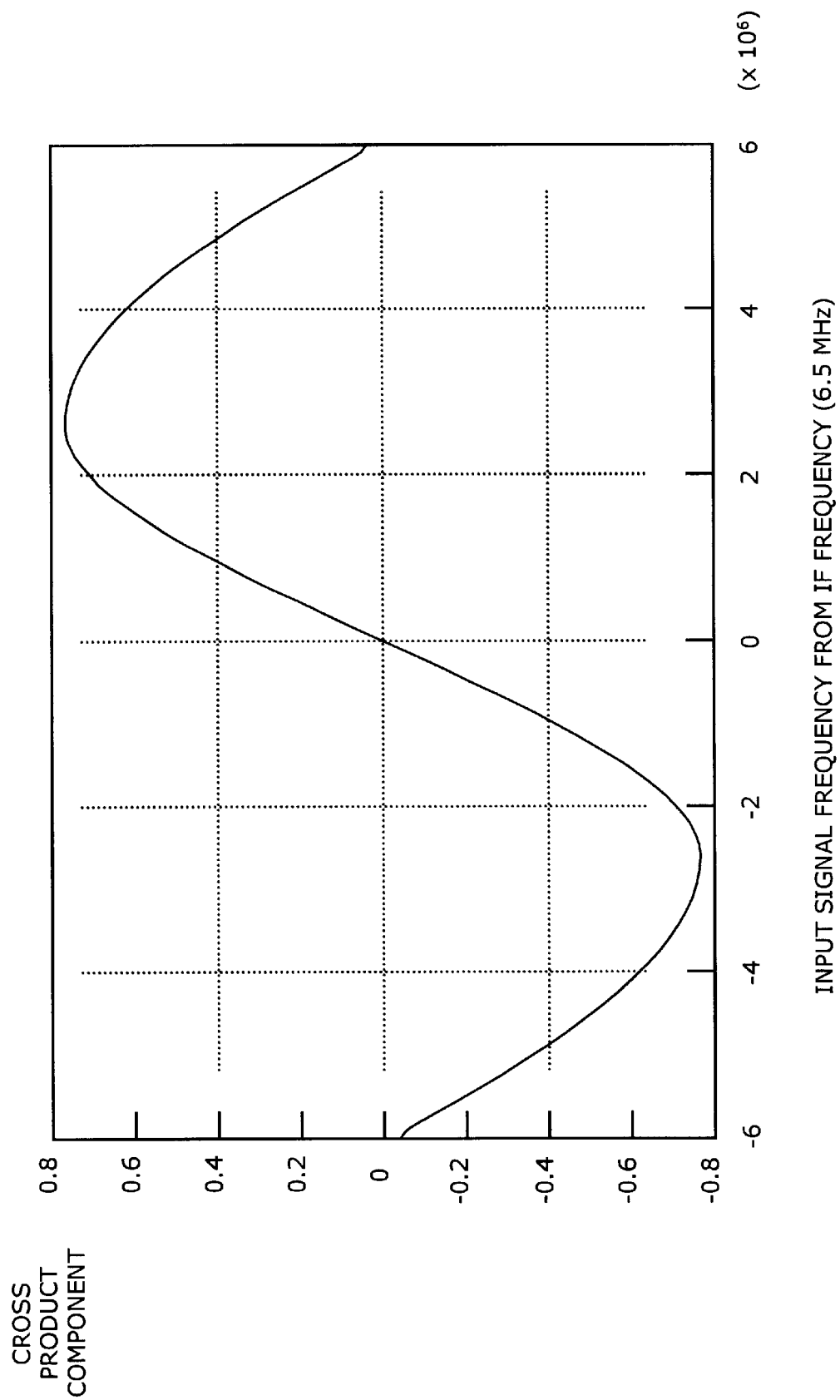
FIG. 13 is a diagram illustration of a characteristic curve of a frequency detector for a sampling frequency of 26 MHz and amplitude A1=1, according to one embodiment of the invention.

For $f_s = 26$ MHz and $A_1 = 1$, the frequency detector characteristics that is given in (18) is plotted in FIG. 13. The values of $\alpha_1$, $\beta_1$, $\alpha_2$, and $\beta_2$ as a function of $f_1$ for various values of $f_2$ are shown in FIGS. 14A to 14C and 15A to 15C.

FIG. 13 is a diagram illustration of a characteristic curve of a frequency detector for a sampling frequency of 26 MHz and amplitude $A_1 = 1$, according to one embodiment of the invention.

Figure 14C:
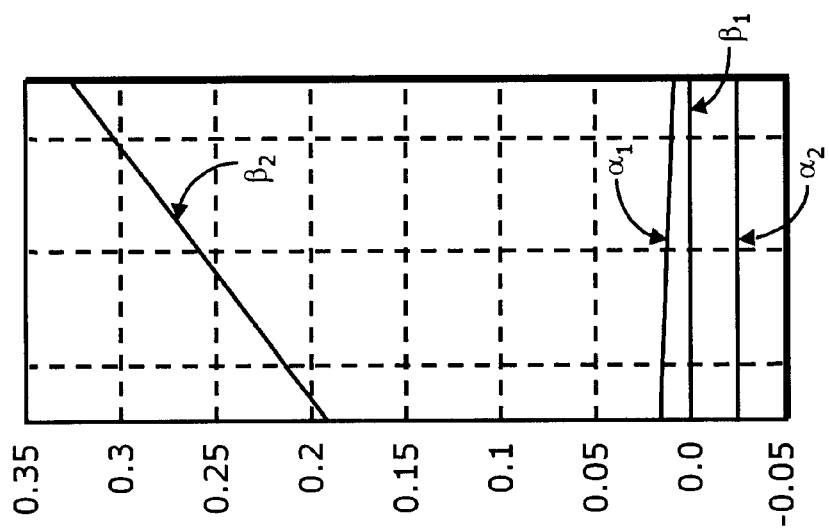
FIG. 14C is a diagram illustration of variations of the coefficients $\alpha_1$, $\beta_1$, $\alpha_2$, and $\beta_2$ as a function of $f_1$ for $f_2$=267 KHz, according to one embodiment of the invention.
Figure 14B:
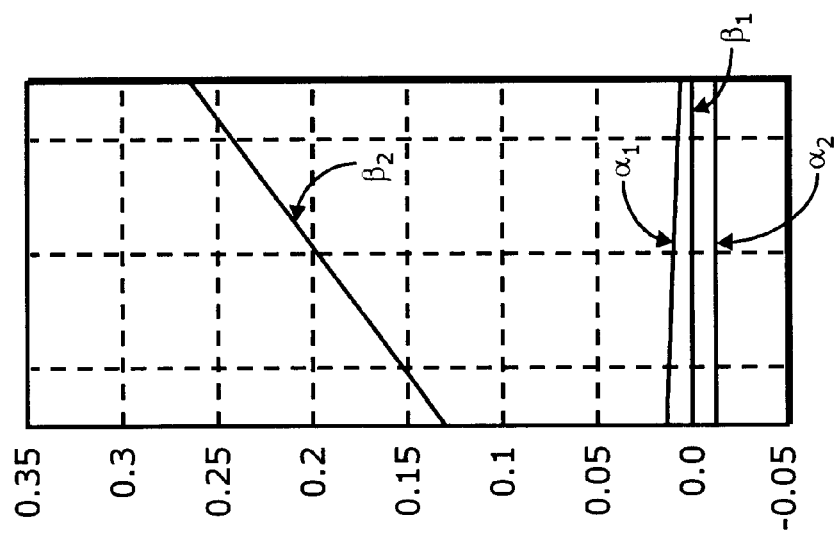
FIG. 14B is a diagram illustration of variations of the coefficients $\alpha_1$, $\beta_1$, $\alpha_2$, and $\beta_2$ as a function of $f_1$ for $f_2$=200 KHz, according to one embodiment of the invention.
Figure 14A:
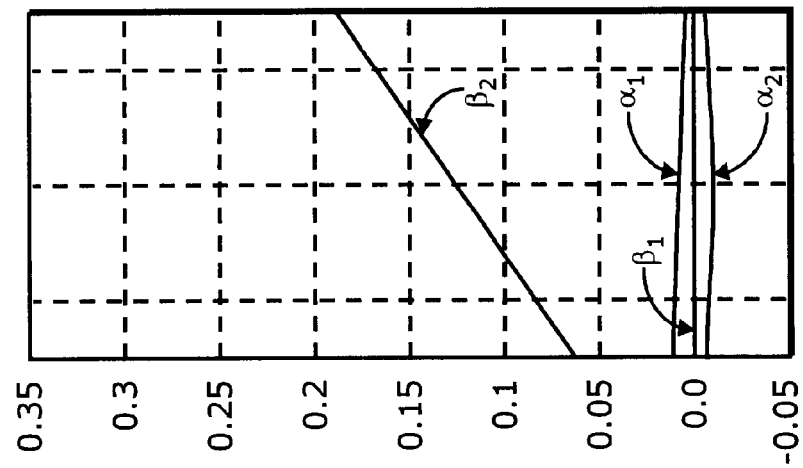
FIG. 14A is a diagram illustration of variations of the coefficients $\alpha_1$, $\beta_1$, $\alpha_2$, and $\beta_2$ as a function of $f_1$ for $f_2$=133 KHz, according to one embodiment of the invention.

Consider the behavior in the presence of two sine waves again. For GSM desired signal and ACI frequencies, the term $\beta_2$ is the largest term among $\alpha_1$, $\beta_1$, $\alpha_2$, and $\beta_2$. FIGS. 14A–14B, 15A–15C illustrate this. In FIGS. 14A to 14B and 15A to 15C, the range of $f_1$ is [−67 KHz, 67 KHz] which is the range of signal frequency for GSM. FIG. 14A is a diagram illustration of variations of the coefficients $\alpha_1$, $\beta_1$, $\alpha_2$, and $\beta_2$ as a function of $f_1$ for $f_2 = 133$ KHz, according to one embodiment of the invention. FIG. 14B is a diagram illustration of variations of the coefficients $\alpha_1$, $\beta_1$, $\alpha_2$, and $\beta_2$ as a function of $f_1$ for $f_2 = 200$ KHz, according to one embodiment of the invention. FIG. 14C is a diagram illustration of variations of the coefficients $\alpha_1$, $\beta_1$, $\alpha_2$, and $\beta_2$ as a function of $f_1$ for $f_2 = 267$ KHz, according to one embodiment of the invention.

Similarly, FIGS. 15A to 15C show the coefficients $\alpha_1$, $\beta_1$, $\alpha_2$, and $\beta_2$ as a function of $f_1$ for $f_2 = 333$ KHz, 400 MHz, and 467 MHz. FIG. 15A is a diagram illustration of variations of the coefficients $\alpha_1$, $\beta_1$, $\alpha_2$, and $\beta_2$ as a function of $f_1$ for $f_2 = 333$ KHz, according to one embodiment of the invention. FIG. 15B is a diagram illustration of variations of the coefficients $\alpha_1$, $\beta_1$, $\alpha_2$, and $\beta_2$ as a function of $f_1$ for $f_2 = 400$ KHz, according to one embodiment of the invention. FIG. 15C is a diagram illustration of variations of the coefficients $\alpha_1$, $\beta_1$, $\alpha_2$, and $\beta_2$ as a function of $f_1$ for $f_2 = 467$ KHz, according to one embodiment of the invention.

Then, (9) can be written as:

$$o(m) = S_1 + S_2 + \frac{A_1 A_2}{2}\beta_2 \cos(x_2) \quad (20)$$

With $2\pi f_1 T \ll 1$, and using small argument approximations for trigonometric terms in the above equation we get $$o(m) = 4\pi T[A_1^2 f_1 + A_2^2 f_2 + A_1 A_2 (f_1 + f_2)\cos(2\pi(f_1 - f_2)2mT)] \quad (21)$$

Note that the output signal has a beat note term whose amplitude is proportional to the sum of input signal frequencies and whose frequency is equal to the difference of input signal frequencies. In the derivations that led to (21) a sampling period of 2T seconds is used due to the sample and operation of the system given in with a period of two clock periods. Since, the sampling interval is 2T, the beat note frequency in (21) is equal to the difference of input signal frequencies.

Deviation from an Ideal Frequency Detector

Figure 16:
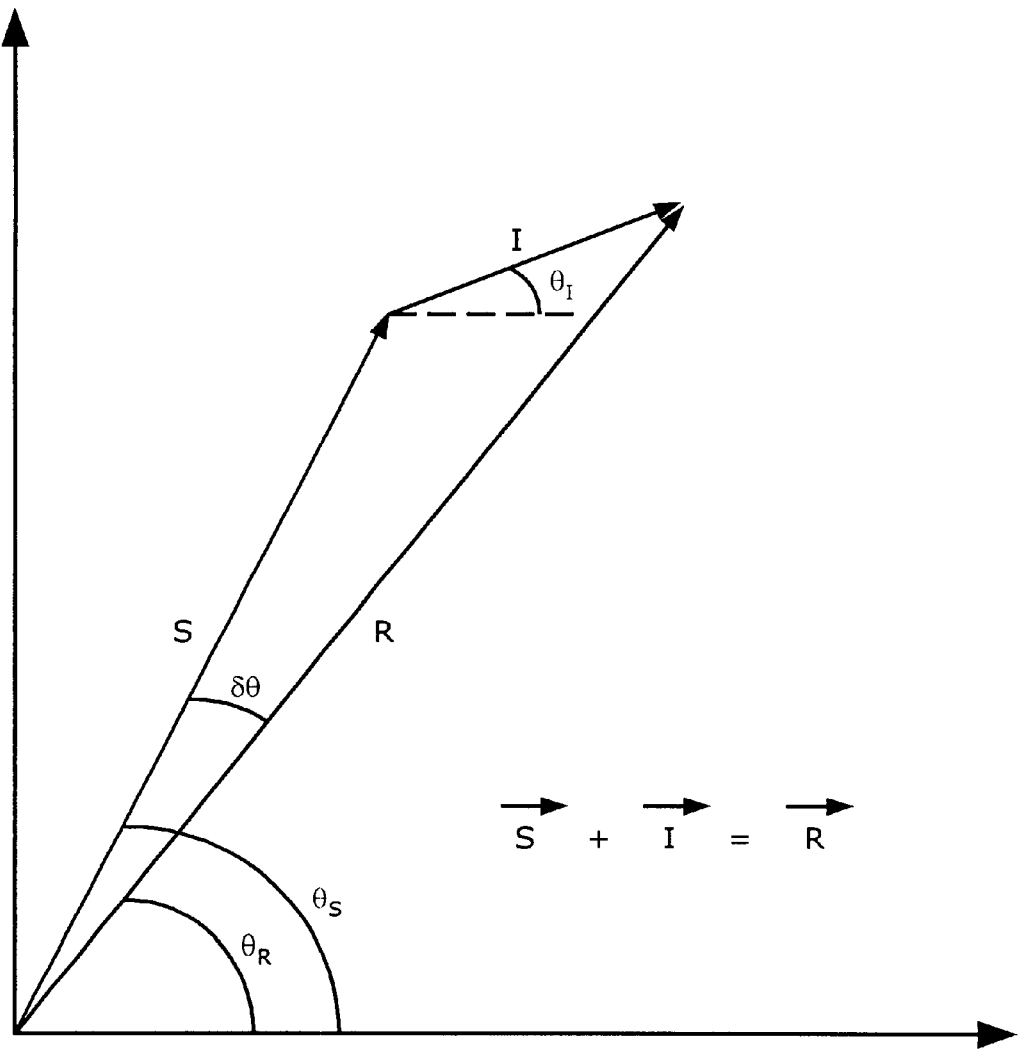
FIG. 16 is a phasor diagram for the desired signal and the interferer according to one embodiment of the invention.

FIG. 16 is a phasor diagram for the desired signal and the interferer according to one embodiment of the invention. The phasor diagram in FIG. 16 depicts a desired signal, S, an interferer, I, and the resultant vector sum of these two, R.

Let the frequency of the desired signal is taken as the reference for the phasor diagram. When there is a frequency offset between the desired signal and the interferer, the interferer vector rotates around the desired signal vector. The angle of the resultant vector, R, changes in time. Rate of change of this angle yields the instantaneous frequency of R. In the following derivations, assume I<<S.

The tangent of the angle $\delta\theta$ is given as $$\tan\delta\theta = \frac{I\sin(\theta_S - \theta_I)}{S + I\cos(\theta_S - \theta_I)} \quad (22)$$

If $\delta\theta$ is small $$\delta\theta = \frac{I\sin(\theta_S - \theta_I)}{S + I\cos(\theta_S - \theta_I)} \quad (23)$$

if S>>I, $$\delta\theta = \frac{I}{S}\sin(\theta_S - \theta_I) \quad (24)$$

if $\theta_s = 2\pi f_1 t$ and $\theta_I = 2\pi f_2 t$, that is, time varying terms due to frequency detuning, $$\delta\theta = \frac{I}{S}\sin(2\pi(f_1 - f_2)t) \quad (25)$$

Then the instantaneous frequency of the resultant vector, R is given by, $$f_R(t) = \frac{1}{2\pi}\frac{d\theta_R}{dt} = \frac{1}{2\pi}\frac{d(\theta_S - \delta\theta)}{dt} = f_1 + \frac{I}{S}(f_1 - f_2)\cos(2\pi(f_1 - f_2)t) \quad (26)$$

The magnitude of the beat notes from the cross product generator has a dependence on the input signal frequencies of desired and interfering signals in a manner that is different from an ideal detector. The magnitude of the beat notes in

(26) is proportional to $(f_1-f_2)$ but the magnitude of the beat notes in (21) is proportional to $(f_1+f_2)$. Note that the ideal detector output is independent of the absolute magnitudes of input desired and ACI signals but is only dependent on the ratio of the amplitudes.

For typical numerical values for the specific frequencies of the GSM modulation and ACIs, the magnitudes of the beat notes that would effect the desired signals would be similar for the cross product detector and an ideal frequency detector.

By comparing (21) with (26), it is seen that the beat note frequencies from the cross product detector and from an ideal detector are the same. This frequency is the difference of the instantaneous frequencies of desired and interfering signals.

Placing Detector Nulls at ACI Frequencies

An alternative idea in suppressing the effects of ACI on the system behavior is to modify the frequency detector characteristics such that the nulls of the detector characteristics is placed at ACI frequencies. This can be accomplished by increasing the delay in the two arms of the frequency detector shown in FIG. 12, $H(z)=z^{-2D}$, where 2D is the number of clock cycles the sampled and held output is delayed by $H(z)$.

For a single sine wave input the output of the modified frequency detector is given as:

$$c(m) = \frac{A_1^2}{2}\cos\left((2D+1)\frac{\pi}{2} + 2\pi f_1 T(2D+1)\right) - \frac{A_1^2}{2}\cos\left((2D-1)\frac{\pi}{2} + 2\pi f_1 T(2D-1)\right) \quad (27)$$

Figure 17:
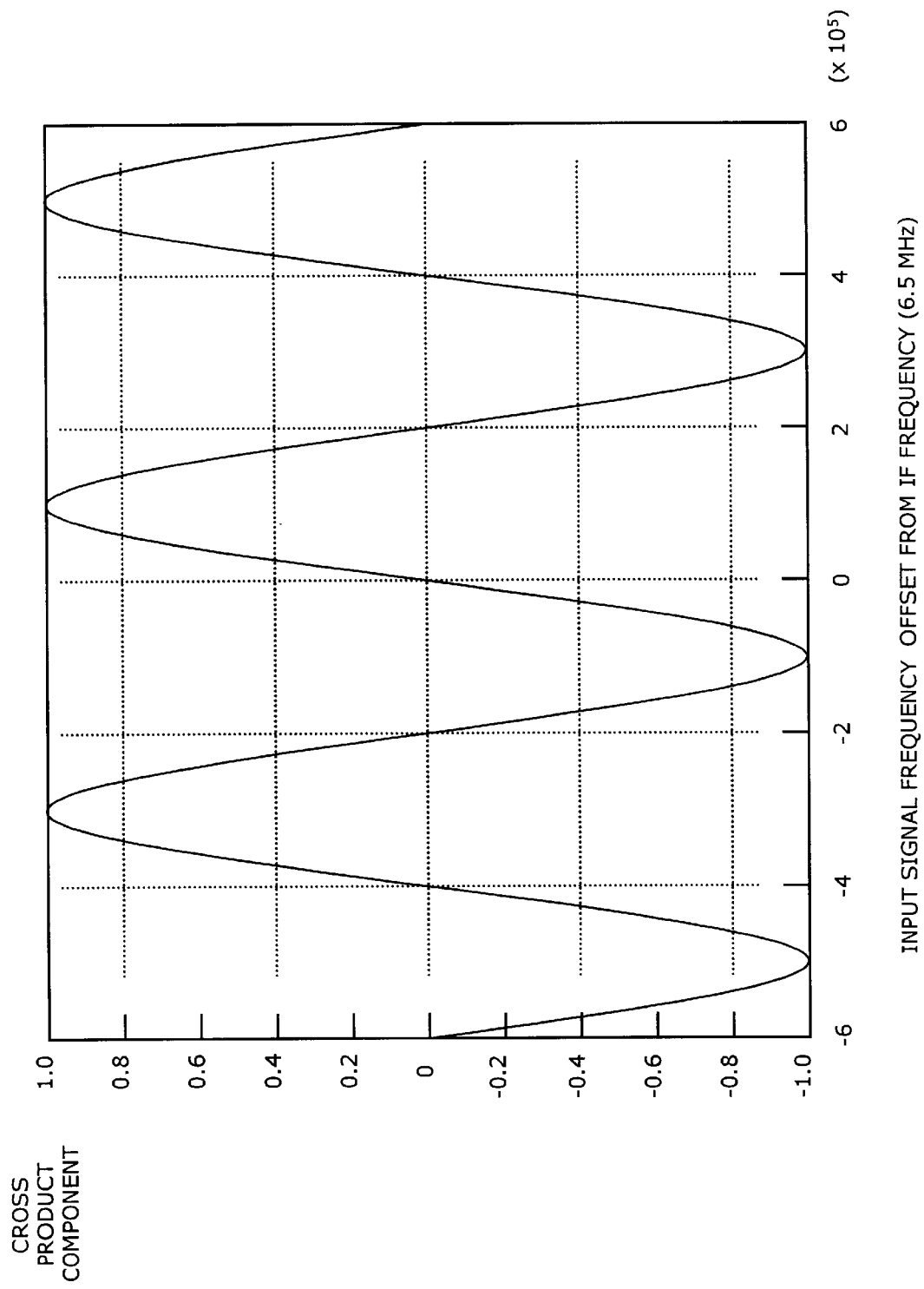
FIG. 17 is a diagram illustration of a characteristic curve of a frequency detector for a sampling frequency of 26 MHz and amplitude A1=1 and the delay interval D=33, according to one embodiment of the invention.

For $f_s=26$ MHz, and $A_1=1$, the frequency detector a characteristics that is given in (27) is plotted in FIG. 17. FIG. 17 is a diagram illustration of a characteristic curve of a frequency detector for a sampling frequency of 26 MHz and amplitude $A_1=1$ and the delay interval D=33, according to one embodiment of the invention. Note that the first null of the frequency detector characteristics is at 200 KHz, and the second null is at 400 KHz. In a GSM system scenario, this can be used to reduce interference effects on the system by suppressing the ACI signals.

Generalized Delay Elements

As an extension of the concept of frequency detection given in the previous sections where the $H(z)$ is a simple delay element, it is also possible to use a filter $H(z)$ of the form:

$$H(z) = \frac{\alpha - z^{-1}}{1 - \alpha z^{-1}} \quad (28)$$

Such type of filters are called "Generalized Delay Elements" because by varying the parameter $\alpha$, it is possible to shape the filter phase transfer function while the amplitude response of the filter is always constant.

If the input sequence to this filter is denoted by $x(n)$ and the output sequence is denoted by $y(n)$, the recursive equation for the output of this filter is given by $$y(n)=x(n-1)-\alpha x(n)+\alpha y(n-1). \quad (29)$$

Figure 18:
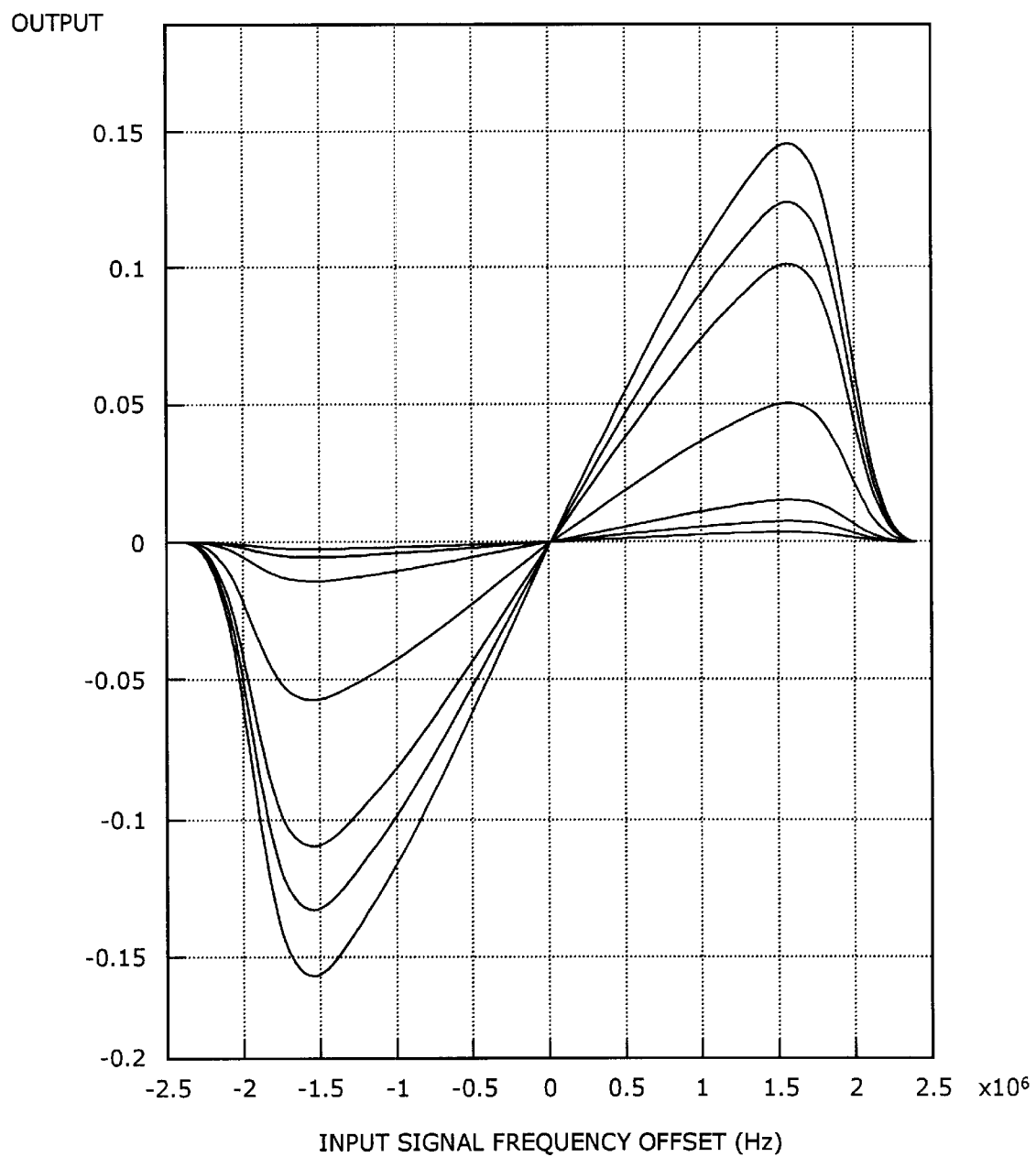
FIG. 18 is a diagram illustration of a family of characteristic curves of a frequency detector as function of positive values of a according to one embodiment of the invention.
Figure 19:
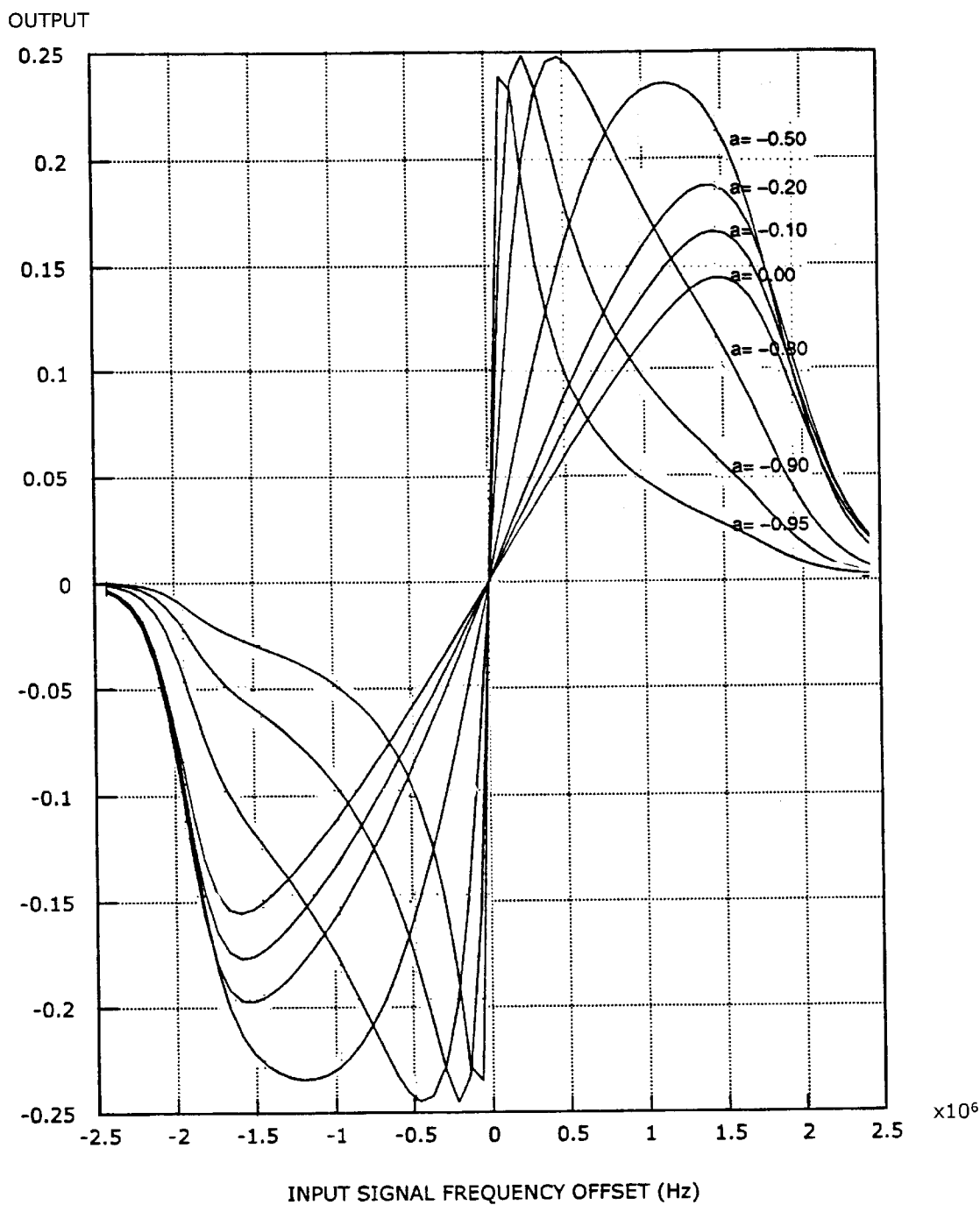
FIG. 19 is a diagram illustration of a family of characteristic curves of a frequency detector as function of negative values of a according to one embodiment of the invention.

Frequency detector characteristics that is obtained by the use of generalized delay elements parameterized by $\alpha$ are given in FIG. 18 and FIG. 19. FIG. 18 is a diagram illustration of a family of characteristic curves of a frequency detector as function of positive values of $\alpha$ according to one embodiment of the invention. FIG. 19 is a diagram illustration of a family of characteristic curves of a frequency detector as function of negative values of $\alpha$ according to one embodiment of the invention.

As shown in FIGS. 18 and 19, the detector characteristics for positive $\alpha$ values are similar in their shape to the case of $\alpha=0.0$ (for which the generalized delay reduces to a simple sample delay). For negative delay values, the response of the detector at high frequency signals is reduced. This may be used to reduce vulnerability to presence of ACI. The apparent reduced response of high frequency is measured in the presence of a single sine wave. The detector's response to a high frequency signal in the presence of desired signal is not reflected in the above figures. However, measurements conducted shows that the magnitude of the beat notes that are due to the presence of ACI is reduced as $\alpha$ is reduced towards $-1$.

POWER DETECTOR

It is useful to determine the power level of a signal so that appropriate gain control action can be taken. In a method that is similar to frequency detection, a power detector is built with only minor changes to the circuit diagram shown in FIG. 12.

Figure 20:
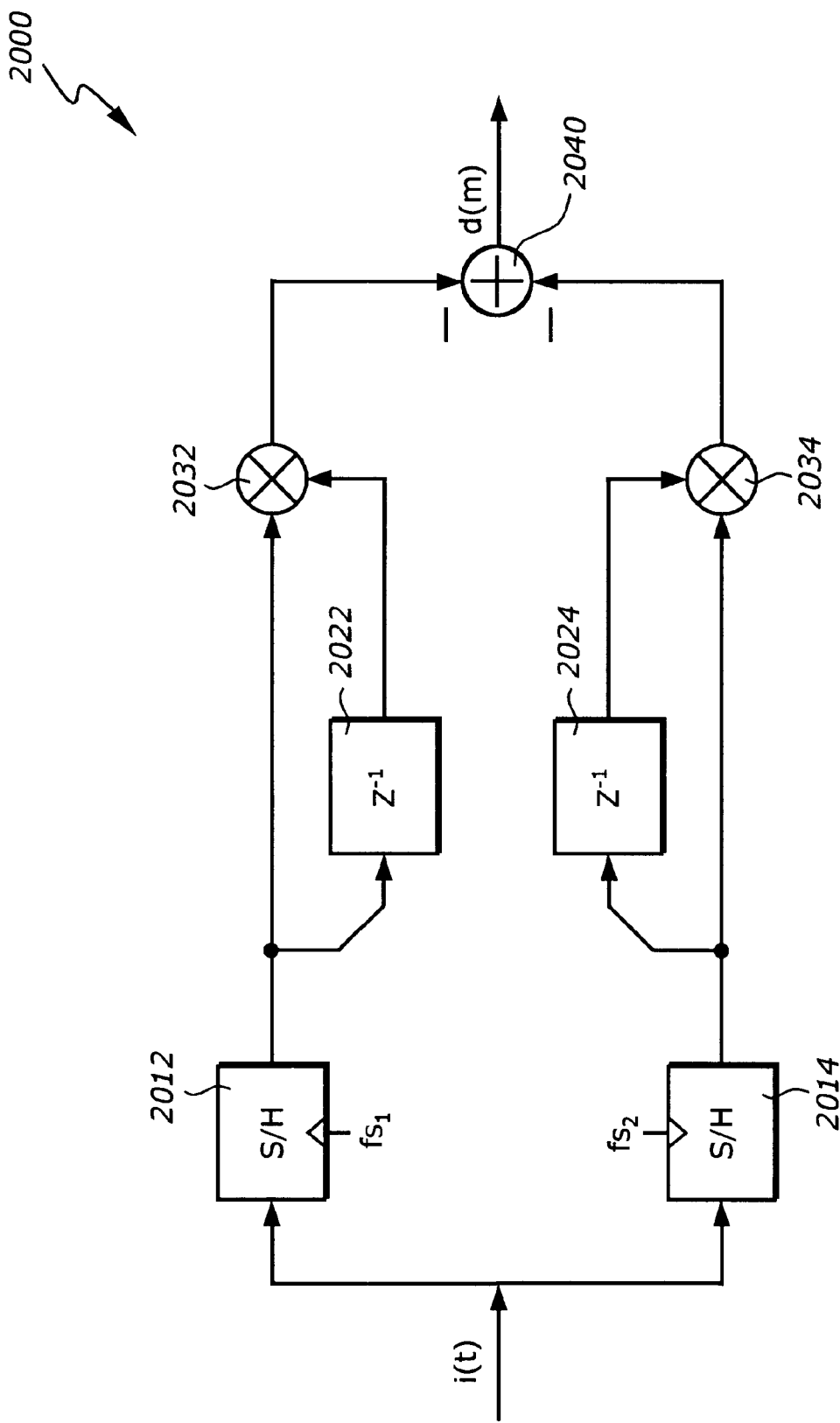
FIG. 20 is a diagram illustration of a power detector according to one embodiment of the invention.

FIG. 20 is a diagram illustration of a power detector 2000 according to one embodiment of the invention. The power detector 2000 includes samplers 2012 and 2014, delay elements 2022 and 2024, multipliers 2032 and 2034, and a combiner 2040.

The samplers 2012 and 2014 are sample-and-hold devices to sample the input signal $i(t)$ with sampling signals $f_{s1}$ and $f_{s2}$, respectively. The sampling signals have the same sampling frequency $f_s$ which is equal to 2 times the carrier frequency. The sampling signals are interleaved, however. Let $t_{s1}$ and $t_{s2}$ be the two sampling instants and T be the sampling period (T=1/$f_s$). Then $t_{s1}=2nT$ and $t_{s2}=(2n+1)T$.

Let the input signals be the sum of two sine waves as given in (6). By using similar trigonometric approximations that were used in order the get the cross product detector output signal, the output of the dot product detector can be written as:

$$d(m)=A_1^2+A_2^2+2A_1A_2\cos(2\pi(f_1-f_2)2mT) \quad (30)$$

In the present of a single sine wave, $A_2=0$ and $d(m)$ is a constant proportional to the power of the input signal. Thus, $d(m)$ includes the constant terms that indicate the sum power in the two input signals and a beat note term that is proportional to $A_1$ and $A_2$. The beat note frequency is proportional to the difference of input signal frequencies.

In the absence of ACI, the output of the power detector can be used as to eliminate the dependence on input signal amplitude. With $A_2=0$, $d(m)=A_1^2$, and, this can be used to eliminate the dependence of $o(m)$ as given in (19) on the input signal magnitude.

In the derivations that led to (30), a sampling period of 2T seconds is used due to the sample and operation of the system given in with a period of two clock periods. Since, the sampling interval is 2T, the beat note frequency in (30) is equal to the difference of input signal frequencies.

Figure 21:
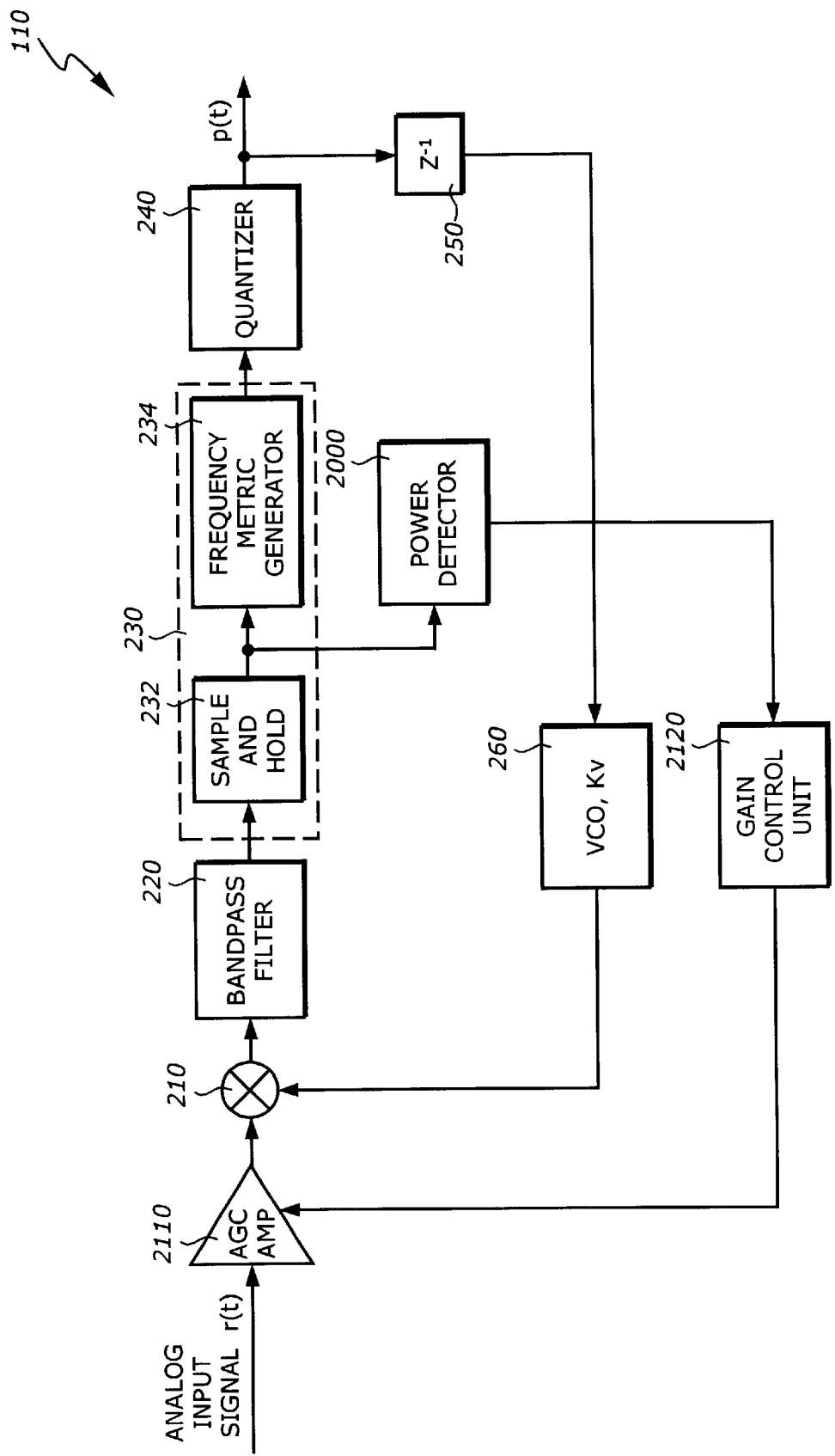
FIG. 21 is a diagram illustration of a first-order interpolative circuit with an automatic gain control and a power detector according to one embodiment of the invention.
Figure 22:
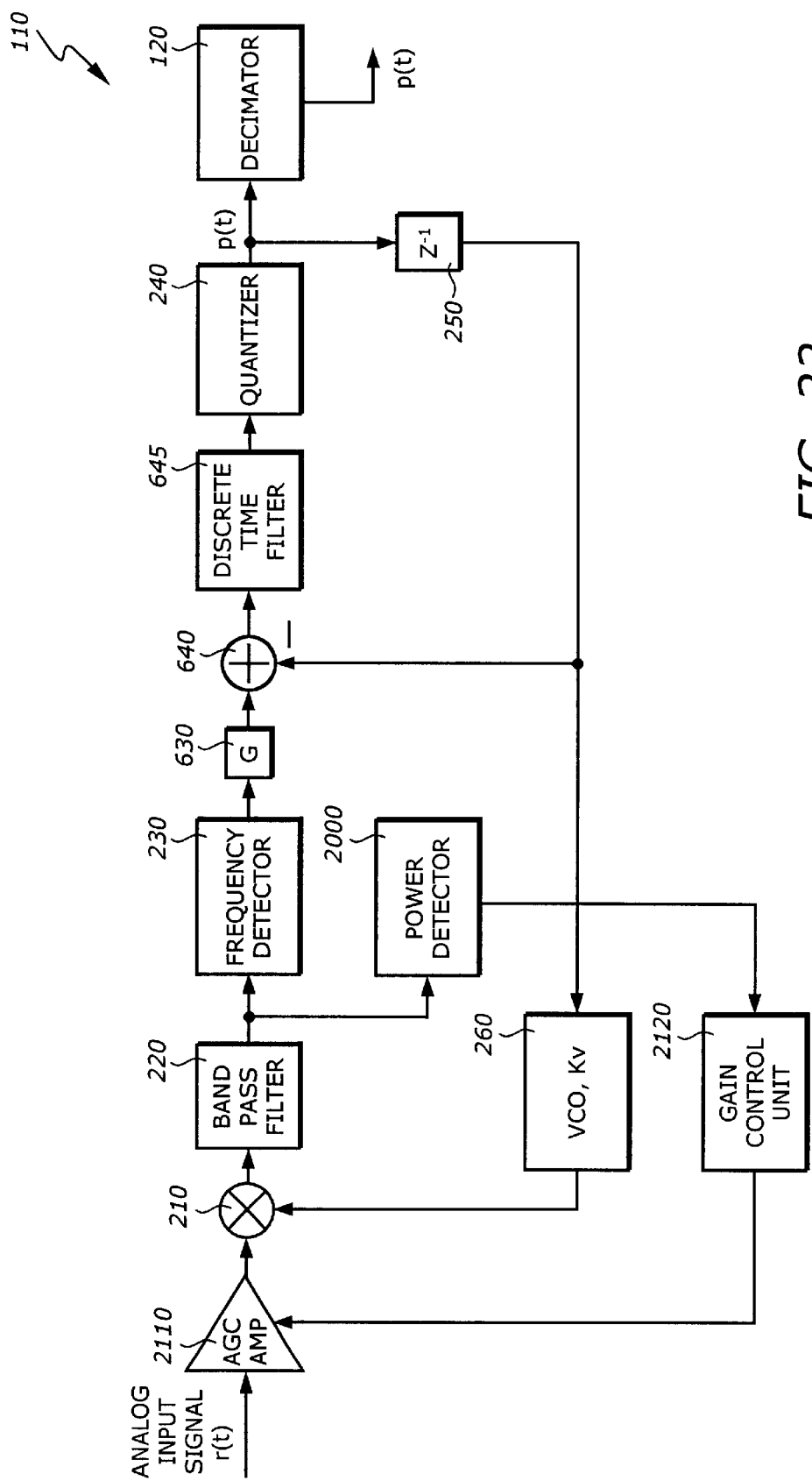
FIG. 22 is a diagram illustration of a second-order OF interpolative circuit with an automatic gain control and a power detector according to one embodiment of the invention.
Figure 23:
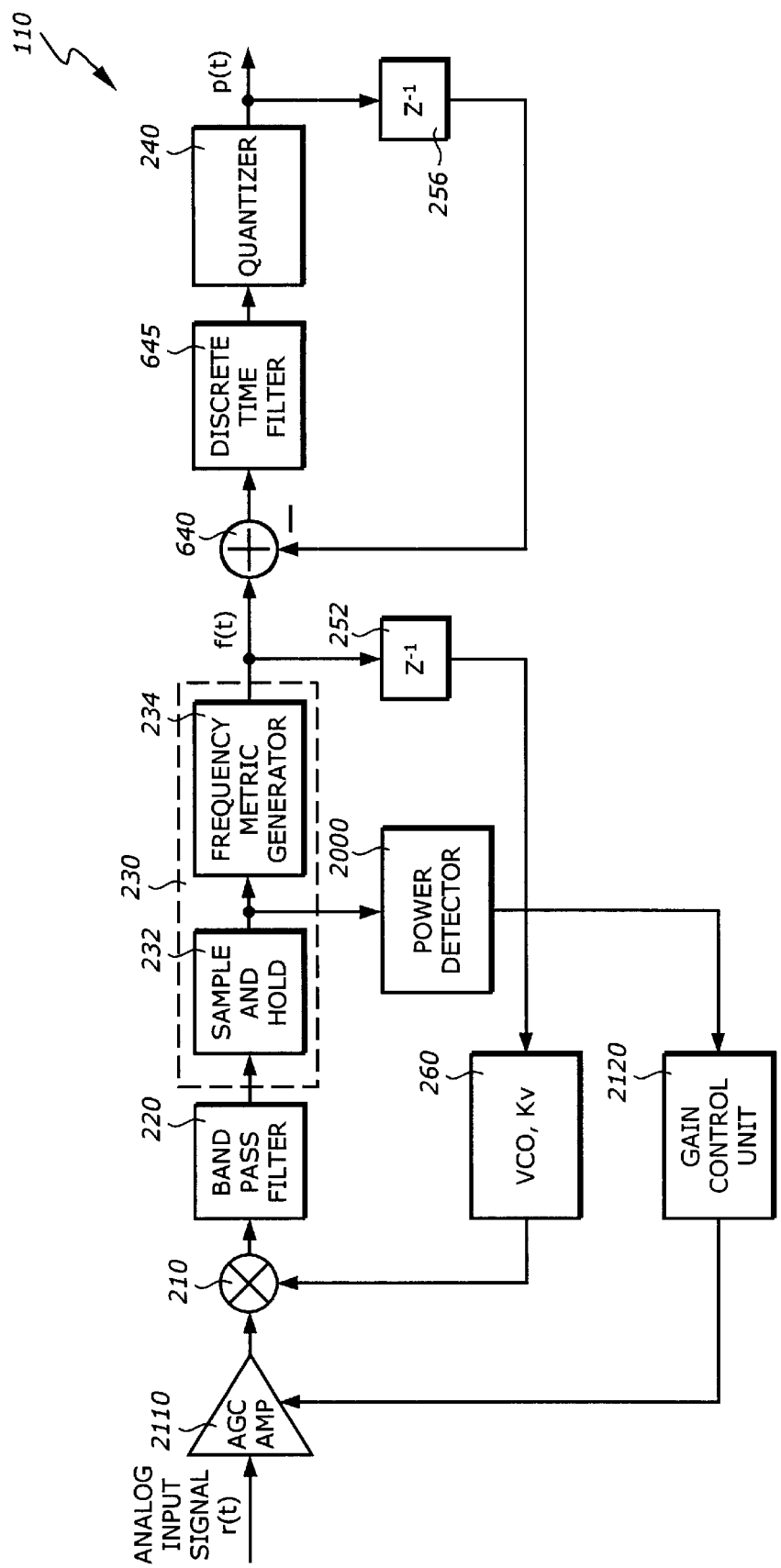
FIG. 23 is a diagram illustration of a cascaded-loop predictive circuit with an automatic gain control and a power detector according to one embodiment of the invention.
Figure 24:
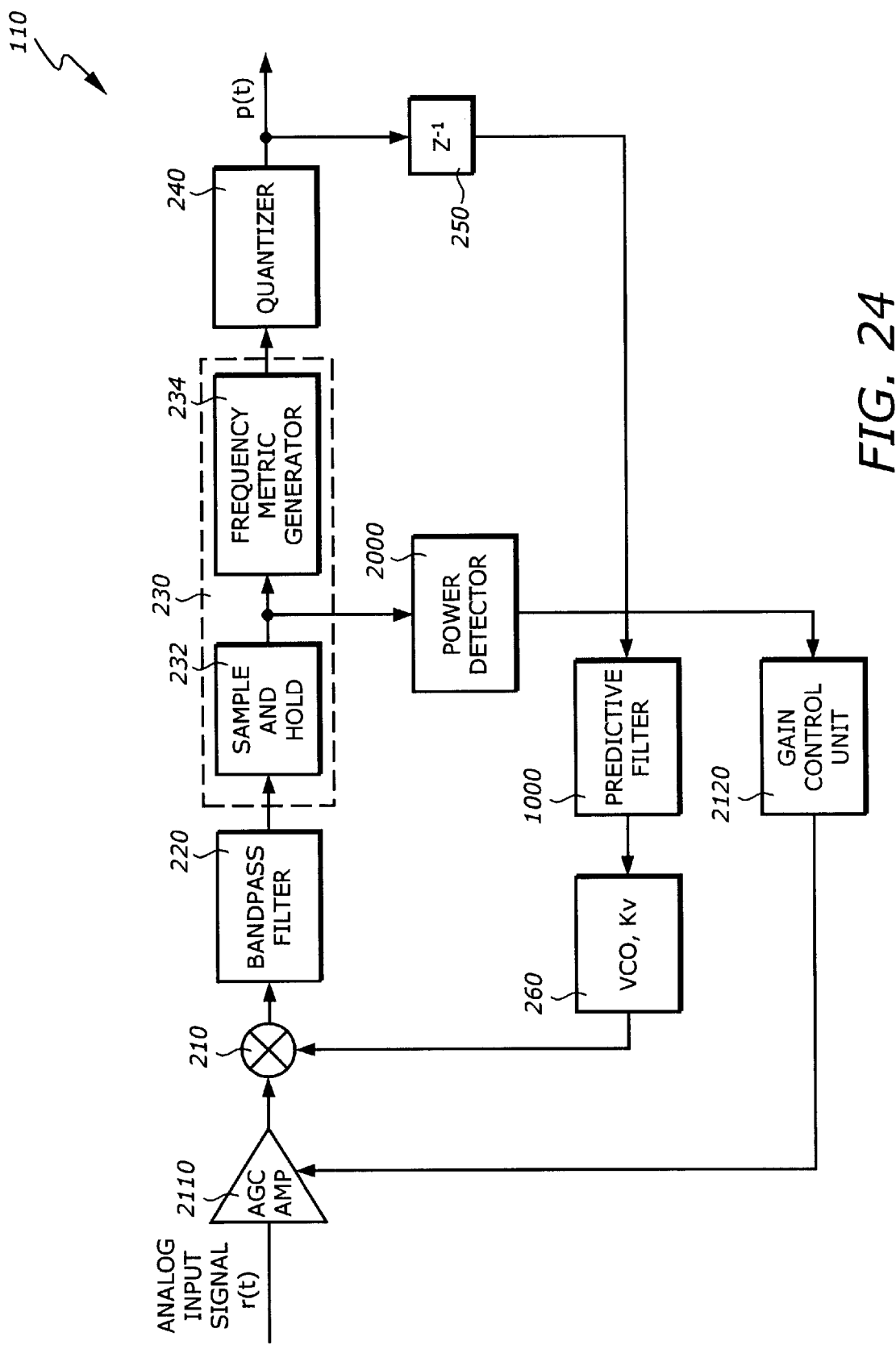
FIG. 24 is a diagram illustration of a single loop predictive circuit with an automatic gain control and a power detector according to one embodiment of the invention.

The feedback circuits in FIG. 2, FIG. 6, FIG. 9, and FIG. 10 can be implemented with the inclusion of the power detector. The resulting circuits are shown in FIGS. 21, 22, 23, and 24, corresponding to FIGS. 2, 6, 9, and 10, respectively. The inclusion of the power detector 2000 in the feedback circuit 110 enables the systems to react satisfactorily to input signal level changes. FIG. 21 is a diagram illustration of a first-order interpolative circuit with an automatic gain control and a power detector according to one embodiment of the invention. FIG. 22 is a diagram illustration of a second-order interpolative circuit with an automatic gain control and a power detector according to one embodiment of the invention. The frequency detector 230 in FIG. 22 may be one of the frequency detectors shown in FIGS. 11 and 12. FIG. 22 also shows a decimator 2010 to generate the desired signal s(t). FIG. 23 is a diagram illustration of a cascaded-loop predictive circuit with an automatic gain control and a power detector according to one embodiment of the invention. FIG. 24 is a diagram illustration of a single loop predictive circuit with an automatic gain control and a power detector according to one embodiment of the invention. These figures show the additional elements including a power detector 2000, an automatic gain control (AGC) amplifier 2110, and a gain control unit 2120.

In these circuits, the power detector 2000 determines a power value representing the power level of the signal as filtered and sampled. The power value is then used to control the gain control unit 2120. The gain control unit 2120 adjusts its control signal accordingly to control the AGC amplifier 2110. The AGC amplifier 2110 provides appropriate gain to the input signal r(t) and keeps it at a constant level.

While the invention has been described with reference to an illustrative embodiment, this description is not intended to be construed in a limiting sense. Various modifications of the illustrative embodiment, as well as other embodiments of the invention, which are apparent to persons skilled in the art to which the invention pertains, are deemed to lie within the spirit and scope of the invention.

What is claimed is:

1. A method to detect an instantaneous frequency of an input signal, the method comprising:
   sampling the input signal at a first sampling frequency to generate a first sampled signal; and
   generating a metric signal based on the first sampled signal, the metric signal having a magnitude proportional to the instantaneous frequency of the input signal.

2. The method of claim 1 wherein the input signal has a plurality of frequencies, the first sampling frequency being proportional to one of the frequencies of the input signal.

3. The method of claim 1 wherein generating the metric signal comprises:
   filtering the first sampled signal by a first filter, a second filter, and a third filter to generate a first filtered signal, a second filtered signal, and a third filtered signal, respectively;
   multiplying the first sampled signal with the first filtered signal to generate a first product signal;
   multiplying the second filtered signal and the third filtered signal to generate a second product signal; and
   combining the first product signal and the second product signal to generate the metric signal.

4. The method of claim 3 wherein the first filter is a delay element having a first delay interval, the second filter is a delay element having a second delay interval, and the third filter is a delay element having a third delay interval.

5. The method of claim 3 wherein combining comprises subtracting the second product signal from the first product signal.

6. The method of claim 1 further comprising:
   sampling the input signal at a second sampling frequency to generate a second sampled signal.

7. The method of claim 6 wherein generating the metric signal comprises:
   filtering the first sampled signal by a first filter to generate a first filtered signal;
   filtering the second sampled signal by a second filter to generate a second filtered signal;
   multiplying the first sampled signal with the second filtered signal to generate a first product signal;
   multiplying the second sampled signal with the first filtered signal to generate a second product signal;
   combining the first product signal and the second product signal to generate a combined signal; and
   sampling the combined signal at an update frequency to generate the metric signal.

8. The method of claim 7 wherein the first filter has a transfer response H(z), H(z) being one of $z^{-D}$, being a positive integer, and $(\alpha - z^{-1})/(1 - \alpha z^{-1})$, a being a real number.

9. The method of claim 7 wherein the second filter has a transfer response H(z), H(z) being one of $z^{-D}$, being a positive integer, and $(\alpha - z^{-1})/(1 - \alpha z^{-1})$, $\alpha$ being a real number.

10. An apparatus to detect an instantaneous frequency of an input signal, the apparatus comprising:
    a sampler to sample the input signal at a first sampling frequency to generate a first sampled signal; and
    a metric generator coupled to the sampler to generate a metric signal based on the first sampled signal, the metric signal having a magnitude proportional to the instantaneous frequency of the input signal.

11. The apparatus of claim 10 wherein the input signal has a plurality of frequencies, the first sampling frequency being proportional to one of the frequencies of the input signal.

12. The apparatus of claim 10 wherein the metric generator comprises:
    first, second, and third filters to filter the first sampled signal by to generate a first filtered signal, a second filtered signal, and a third filtered signal, respectively;
    a first multiplier coupled to the first sampler and the first filter to multiply the first sampled signal with the first filtered signal to generate a first product signal;
    a second multiplier coupled to the second filter and the third filter to multiply the second filtered signal and the third filtered signal to generate a second product signal; and
    a combiner coupled to the first and second multipliers to combining the first product signal and the second product signal to generate the metric signal.

13. The apparatus of claim 12 wherein the first filter is a delay element having a first delay interval, the second filter is a delay element having a second delay interval, and the third filter is a delay element having a third delay interval.

14. The apparatus of claim 12 wherein the combiner comprises a subtractor to subtract the second product signal from the first product signal.

15. The apparatus of claim 10 further comprising:
    a second sampler to sample the input signal at a second sampling frequency to generate a second sampled signal.

16. The apparatus of claim 15 wherein the metric generator comprises:
    a first filter coupled to the first sampler to generate a first filtered signal from the first sampled signal;

a second filter coupled to the second sampler to generate a second filtered signal from the second sampled signal;

a first multiplier coupled to the first sampler and the second filter to generate a first product signal by multiplying the first sampled signal with the second filtered signal;

a second multiplier coupled to the second sampler and the first filter to generate a second product signal by multiplying the second sampled signal with the first filtered signal;

a combiner coupled to the first and second multipliers to generate a combined signal by combining the first product signal and the second product signal; and a third sampler coupled to the combiner to generate the metric signal by sampling the combined signal at an update frequency.

17. The apparatus of claim 16 wherein the first filter has a transfer response H(z), H(z) being one of $z^{-D}$, D being a positive integer, and $(\alpha-z^{-1})/(1-\alpha z^{-1})$, $\alpha$ being a real number.

18. The apparatus of claim 16 wherein the second filter has a transfer response H(z), H(z) being one of $z^{-D}$, D being a positive integer, and $(\alpha-z^{-1})/(1-\alpha z^{-1})$, $\alpha$ being a real number.

* * * * *